United States Patent
Lee et al.

(10) Patent No.: US 9,543,155 B2
(45) Date of Patent: Jan. 10, 2017

(54) METHOD OF FORMING MINUTE PATTERNS AND METHOD OF MANUFACTURING A SEMICONDUCTOR DEVICE USING THE SAME

(71) Applicants: Bok-Young Lee, Seoul (KR); Yoo-Jung Lee, Hwaseong-si (KR); Dong-Hoon Khang, Daegu (KR); Do-Hyoung Kim, Hwaseong-si (KR); Cheol Kim, Hwaseong-si (KR); In-Hee Lee, Yongin-si (KR); Ji-Eun Han, Incheon (KR)

(72) Inventors: Bok-Young Lee, Seoul (KR); Yoo-Jung Lee, Hwaseong-si (KR); Dong-Hoon Khang, Daegu (KR); Do-Hyoung Kim, Hwaseong-si (KR); Cheol Kim, Hwaseong-si (KR); In-Hee Lee, Yongin-si (KR); Ji-Eun Han, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/975,932

(22) Filed: Dec. 21, 2015

(65) Prior Publication Data
US 2016/0218010 A1     Jul. 28, 2016

(30) Foreign Application Priority Data
Jan. 23, 2015   (KR) .......................... 10-2015-0011475

(51) Int. Cl.
*H01L 21/28*      (2006.01)
*H01L 29/66*      (2006.01)
*H01L 27/11*      (2006.01)

(52) U.S. Cl.
CPC ..... *H01L 21/28132* (2013.01); *H01L 27/1104* (2013.01); *H01L 27/1116* (2013.01); *H01L 29/66545* (2013.01)

(58) Field of Classification Search
CPC ............ H01L 21/28132; H01L 27/1116; H01L 27/1104; H01L 29/66545
See application file for complete search history.

(56) References Cited

U.S. PATENT DOCUMENTS

| 5,965,464 A | 10/1999 | Tsai et al. |
| 7,972,959 B2 | 7/2011 | Mebarki et al. |
| (Continued) | | |

FOREIGN PATENT DOCUMENTS

| KR | 0790998 | 12/2007 |
| KR | 0850216 | 7/2008 |
| (Continued) | | |

*Primary Examiner* — Kyoung Lee
(74) *Attorney, Agent, or Firm* — Harness, Dickey & Pierce, P.L.C.

(57) ABSTRACT

A method includes forming a first etch target layer and a first mask layer on a substrate. Sacrificial patterns extending in a first direction are formed on the first mask layer in a second direction. Spacers are formed on sidewalls of the sacrificial patterns. After removing the sacrificial patterns, the first mask layer is etched using the spacers as an etching mask to form first masks. Second masks are formed on sidewalls of each first mask to define a third masks including each first mask and the second masks on sidewalls of each first mask. The first etch target layer is etched using the first and third masks as an etching mask to form first and second patterns in the first and second regions, respectively. Each first pattern has a first width, and each second pattern has a second width greater than the first width.

20 Claims, 46 Drawing Sheets

(56) References Cited

U.S. PATENT DOCUMENTS

| | | |
|---|---|---|
| 8,099,686 B2 | 1/2012 | Schultz |
| 8,312,394 B2 | 11/2012 | Ban et al. |
| 8,450,833 B2 | 5/2013 | Kim |
| 8,669,186 B2 | 3/2014 | LiCausi |
| 8,735,296 B2 | 5/2014 | Jung et al. |
| 8,790,522 B1 | 7/2014 | Schmid et al. |
| 2006/0234166 A1 | 10/2006 | Lee et al. |
| 2008/0081461 A1 | 4/2008 | Lee et al. |
| 2008/0280431 A1 | 11/2008 | Jung et al. |
| 2009/0277382 A1 | 11/2009 | Mizuno et al. |
| 2009/0286404 A1 | 11/2009 | Park et al. |
| 2009/0317748 A1 | 12/2009 | Choi |
| 2010/0136790 A1* | 6/2010 | Chang ............... H01L 21/0337 438/694 |
| 2010/0248492 A1 | 9/2010 | Yoon et al. |
| 2012/0156876 A1 | 6/2012 | Chen et al. |
| 2013/0217233 A1 | 8/2013 | Chang et al. |
| 2014/0083972 A1 | 3/2014 | Oyama et al. |

FOREIGN PATENT DOCUMENTS

| | | |
|---|---|---|
| KR | 2009-0010399 A | 1/2009 |
| KR | 0880323 | 1/2009 |
| KR | 0934836 | 12/2009 |
| KR | 2010-0079947 A | 7/2010 |
| KR | 1082092 | 11/2011 |
| KR | 1167506 | 7/2012 |
| KR | 2014-0015294 A | 2/2014 |
| KR | 1389518 | 4/2014 |

\* cited by examiner

FIG. 45
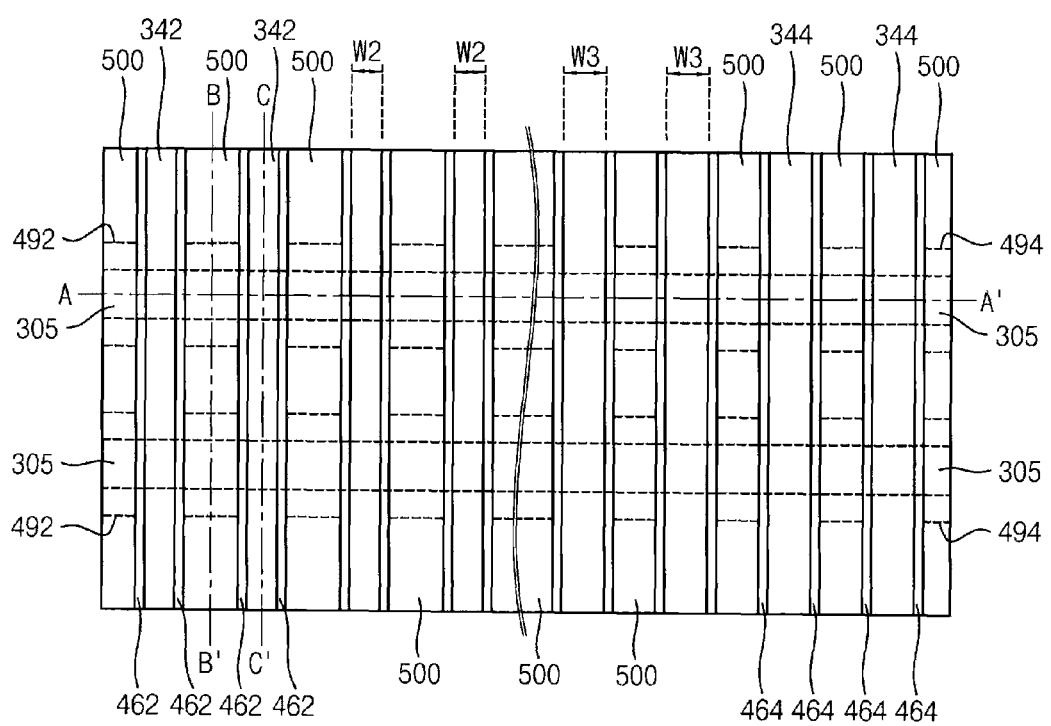
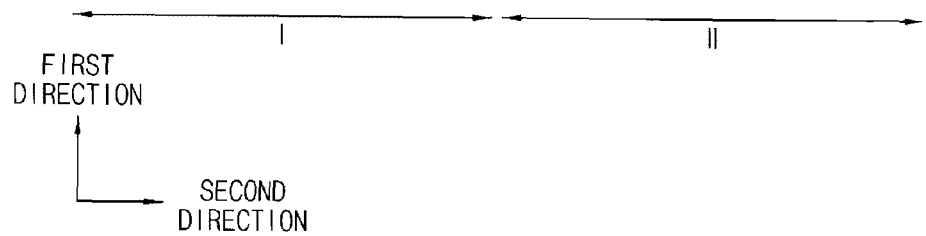

FIG. 48
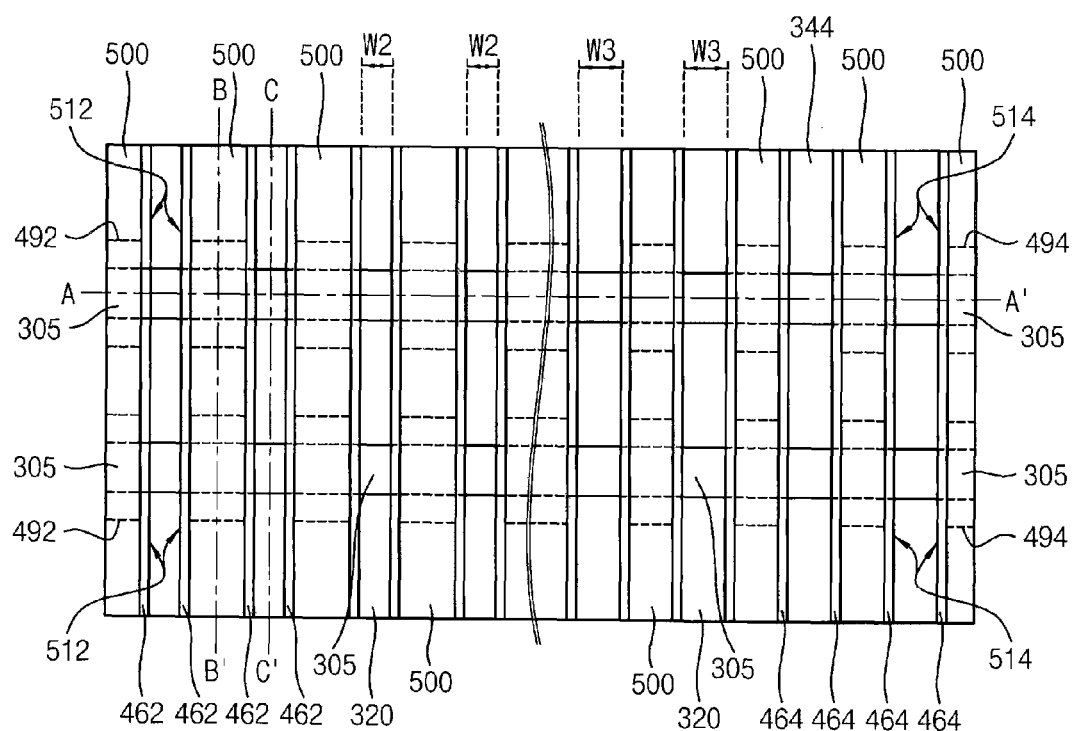
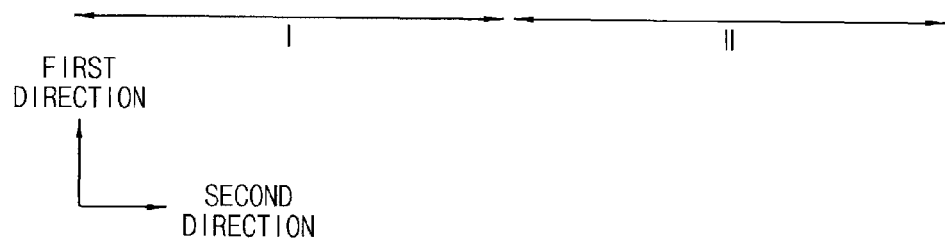

METHOD OF FORMING MINUTE PATTERNS AND METHOD OF MANUFACTURING A SEMICONDUCTOR DEVICE USING THE SAME

CROSS-REFERENCE TO RELATED APPLICATION

This application claims priority under 35 USC §119 to Korean Patent Application No. 10-2015-0011475, filed on Jan. 23, 2015 in the Korean Intellectual Property Office (KIPO), the contents of which are herein incorporated by reference in their entirety.

BACKGROUND

1. Field

Example embodiments relate to methods of forming minute patterns and/or methods of manufacturing a semiconductor device using the same. Example embodiment relates to methods of forming minute patterns each having a width of less than about 25 nm and/or methods of manufacturing a semiconductor device using the same.

2. Description of the Related Art

When a gate pattern having a minute width of less than about 20 nm is formed, a double patterning process may be performed. However, in a double patterning process, a gate pattern may be formed to have a constant width, and thus it may be difficult to form a gate pattern having different widths at different regions.

SUMMARY

According to example embodiments, there is provided a method of forming minute patterns. In the method, a first etch target layer and a first mask layer may be sequentially formed on a substrate having first and second regions therein. A plurality of sacrificial patterns may be formed on the first mask layer in a second direction, and each of the sacrificial patterns may extend in a first direction crossing the second direction. Spacers may be formed on both sidewalls of each of the sacrificial patterns. The sacrificial patterns may be removed. The first mask layer may be etched using the spacers as an etching mask to form a plurality of first masks. Second masks may be formed on both sidewalls of each of the first masks in the second direction in the second region to define a plurality of third masks, and each of the third masks may include each of the first masks and the second masks on both sidewalls thereof. The first etch target layer may be etched using the first and third masks as an etching mask to form a plurality of first patterns and a plurality of second patterns in the first and second regions, respectively. Each of the first patterns may have a first width in the second direction, and each of the second patterns may have a second width greater than the first width in the second direction.

In some example embodiments, when the second masks are formed on both sidewalls of each of the first masks in the second direction in the second region, a second mask layer may be formed on the first masks and the first etch target layer. A portion of the second mask layer in the first region may be removed to expose the first masks and a first portion of a top surface of the first etch target layer, while a portion of the second mask layer in the second region may remain. A portion of the second mask layer on a second portion of a top surface of the first etch target layer remaining in the second region may be removed.

In some example embodiments, when the second mask layer is formed on the first masks and the first etch target layer, the second mask layer may be formed to have a constant thickness.

In some example embodiments, when the portion of the second mask layer in the first region is removed, while the portion of the second mask layer in the second region remains, a first photoresist pattern may be formed on the second mask layer to cover the second region. An etching process may be performed using the first photoresist pattern as an etching mask to remove the portion of the second mask layer in the first region.

In some example embodiments, before forming a second mask layer on the first masks and the first etch target layer, the spacers may be removed.

In some example embodiments, when the portion of the second mask layer on the top surface of the first etch target layer in the second region is removed, not only the portion of the second mask layer on the second portion of the top surface of the first etch target layer in the second region, but also portions of the second mask layer on top surfaces of the first masks in the second region may be removed to expose the second portion of the top surface of the first etch target layer and the top surfaces of the first masks in the second region.

In some example embodiments, when the portion of the second mask layer on the second portion of the top surface of the first etch target layer in the second region and the portions of the second mask layer on the top surfaces of the first masks in the second region are removed to expose the second top surface of the first etch target layer, the top surfaces of the first masks in the second region, top surfaces of the first masks, the first portion of the top surface of the first etch target layer in the first region, the exposed top surfaces of the first masks, and the second portion of the top surface of the first etch target layer in the second region may be removed.

In some example embodiments, when the portion of the second mask layer, the top surfaces of the first masks, and the first portion and the second portion of the top surface of the first etch target layer are removed, a dry etching process may be performed using an etching gas.

In some one example embodiments, before sequentially forming the first etch target layer and the first mask layer, a second etch target layer may be formed on the substrate.

In some one example embodiments, the first etch target layer may include a material having an etch selectivity with respect to the first and second masks and the second etch target layer.

In at least one example embodiment, the first etch target layer may include polysilicon, the first masks and the second etch target layer may include a nitride, and the second masks may include an oxide.

In some example embodiments, after etching the first etch target layer using the first and third masks as an etching mask to form the first and second patterns, the second etch target layer may be etched using the first and second patterns as an etching mask to form a plurality of third patterns and a plurality of fourth patterns in the first and second regions, respectively. Each of the third patterns may have the first width in the second direction, and each of the fourth patterns may have the second width in the second direction.

In some one example embodiments, before forming the second etch target layer on the substrate, a third etch target layer may be formed on the substrate. After etching the second etch target layer using the first and second patterns as an etching mask to form the third and fourth patterns, the third etch target layer may be etched using the third and fourth patterns as an etching mask to form a plurality of fifth patterns and a plurality of sixth patterns in the first and second regions, respectively. Each of the fifth patterns may have the first width in the second direction, and each of the sixth patterns may have the second width in the second direction.

In some example embodiments, the first, second and third etch target layers may include polysilicon, silicon nitride, and polysilicon, respectively.

In some example embodiments, when the plurality of sacrificial patterns is formed on the first mask layer in the second direction, a sacrificial layer may be formed on the first mask layer. A second photoresist pattern is formed on the sacrificial layer. The sacrificial layer is etched using the second photoresist pattern as an etching mask.

In some example embodiments, when the spacers are formed on both sidewalls of each of the sacrificial patterns, a spacer layer may be formed on the first mask layer to cover the sacrificial patterns. The spacer layer may be anisotropically etched.

In some example embodiments, the spacer layer may be formed by an ALD process using an oxide.

In some example embodiments, each of the spacers may be formed to have a width in the second direction less than that of each of the sacrificial patterns.

In some example embodiments, the width of each of the spacers may be equal to or less than about 20 nm.

In some example embodiments, each of the first and second mask layers may include a material having an etch selectivity with respect to the first etch target layer.

In some example embodiments, the first and second mask layers may include a nitride and an oxide, respectively, and the first etch target layer may include polysilicon.

In some example embodiments, the second mask layer may be formed by an ALD process using an oxide.

In some example embodiments, the sacrificial patterns may include polysilicon, amorphous carbon layer (ACL), or spin-on organic hardmask (SOH).

In some example embodiments, the first region may be a logic region in which logic devices are formed, and the second region may be a static random access memory (SRAM) region in which SRAM devices are formed.

In some example embodiments, the first and second directions may cross each other at a right angle.

According to example embodiments, there is provided a method manufacturing a semiconductor device. In the method, a gate layer, a hard mask layer and an intermediate layer may be sequentially formed on a substrate having first and second regions therein. A plurality of first masks may be formed on the intermediate layer in a second direction, and each of the first masks may extend in a first direction crossing the second direction. A second mask layer may be formed on the first masks and the intermediate layer. A portion of the second mask layer in the first region may be removed, while a portion of the second mask layer in the second region remains. Portions of the second mask layer on top surfaces of the first masks and a top surface of the intermediate layer may be removed to form second masks on both sidewalls of each of the first masks in the second region. The top surfaces of the first masks and the top surface of the intermediate layer may be exposed, and each of the first masks and the second masks on sidewalls of each of the first masks may define a third mask. The intermediate layer may be etched using the first and third masks as an etching mask to form a plurality of first patterns and a plurality of second patterns in the first and second regions, respectively. Each of the first patterns may have a first width in the second direction, and each of the second patterns may have a second width in the second direction greater than the first width. The hard mask layer may be etched using the first and second patterns as an etching mask to form a plurality of first hard masks and a plurality of second hard masks in the first and second regions, respectively. The gate layer may be etched using the first and second hard masks as an etching mask to form first and second gates in the first and second regions, respectively.

In some example embodiments, when the portion of the second mask layer in the first region is removed, while the portion of the second mask layer in the second region remains, a first photoresist pattern may be formed on the second mask layer to cover the second region. A wet etching process may be performed using the first photoresist pattern as an etching mask to remove the portion of the second mask layer in the first region.

In some example embodiments, when the portions of the second mask layer on the top surfaces of the first masks and the top surface of the intermediate layer are removed to form the second masks on both sidewalls of each of the first masks in the second region, top surfaces of the first masks and a top surface of the intermediate layer in the first region, and the exposed top surfaces of the first masks and the exposed top surface of the intermediate layer in the second region may be removed.

In at least one example embodiment, when the portions of the second mask layer, the top surfaces of the first masks and the top surface of the intermediate layer are removed, a dry etching process may be performed.

In some example embodiments, the first masks, the second mask layer and the intermediate layer may include materials having etch selectivities with respect to one another.

In some example embodiments, the first masks and the intermediate layer may include a nitride and polysilicon, respectively, and the second mask layer may be formed using an oxide by an ALD process.

In some example embodiments, the hard mask layer and the gate layer may include a nitride and polysilicon, respectively.

In some example embodiments, when the plurality of first masks is formed on the intermediate layer, a first mask layer and a sacrificial layer may be sequentially formed on the intermediate layer. A second photoresist pattern may be formed on the sacrificial layer. The sacrificial layer may be etched using the second photoresist pattern as an etching mask to form a plurality of sacrificial patterns in the second direction, and each of the sacrificial patterns may extend in the first direction. A spacer layer may be formed on the first mask layer to cover the sacrificial patterns. The spacer layer may be anisotropically etched to form spacers on both sidewalls of each of the sacrificial patterns. The sacrificial patterns may be removed. After removing the sacrificial patterns, the first mask layer may be etched using the spacers as an etching mask.

In some example embodiments, the sacrificial layer may include polysilicon, amorphous carbon layer (ACL) or spin-on organic hardmask (SOH), the first mask layer may include a nitride, and the spacer layer may be formed by an ALD process using an oxide.

In some example embodiments, the first region may be a logic region in which logic devices are formed, and the second region may be a static random access memory (SRAM) region in which SRAM devices are formed.

In some example embodiments, the first and second hard masks may be formed to have first and second widths, respectively, in the second direction.

According to example embodiments, there is provided a method manufacturing a semiconductor device. In the method, an isolation layer pattern may be formed on a substrate including first and second regions to define an active fin on the substrate. A lower portion of the active fin may be covered by the isolation layer pattern and an upper portion of the active pattern may protrude above a top surface of the isolation layer pattern. A dummy gate layer structure, a hard mask layer and an intermediate layer may be sequentially formed on the active fin and the isolation layer pattern. A plurality of first masks may be formed on the intermediate layer in a second direction, and each of the first masks may extend in a first direction substantially perpendicular to the second direction. Second masks may be formed on both sidewalls of each of the first masks in the second region to define a third mask. The third mask may include each of the first masks and the second masks on the sidewall of each of the first masks. The intermediate layer may be etched using the first and third masks as an etching mask to form a plurality of first patterns and a plurality of second patterns in the first and second regions, respectively. The hard mask layer may be etched using the first and second patterns as an etching mask to form a plurality of first hard masks and a plurality of second hard masks in the first and second regions, respectively. The dummy gate layer structure may be etched using the first and second hard masks as an etching mask to form a plurality of first dummy gate structures and a plurality of second dummy gate structures in the first and second regions, respectively. Each of the first dummy gate structures may have a first width in the second direction, and each of the second dummy gate structures may have a second width in the second direction greater than the first width. The first and second dummy gate structures may be replaced with first and second gate structures, respectively.

In some example embodiments, when the plurality of first masks is formed on the intermediate layer in the second direction, a first mask layer and a sacrificial layer may be sequentially formed on the intermediate layer. The sacrificial layer may be patterned to form a plurality of sacrificial patterns in the second direction, and each of the sacrificial patterns may extend in the first direction. A spacer layer may be formed on the first mask layer to cover the sacrificial patterns. The spacer layer may be anisotropically etched to form spacers on both sidewalls of each of the sacrificial patterns. The sacrificial patterns may be removed. After removing the sacrificial patterns, the first mask layer may be etched using the spacers as an etching mask.

In some example embodiments, when the second masks are formed on both sidewalls of each of the first masks in the second region, a second mask layer may be conformally formed on the first masks and the intermediate layer. After forming a photoresist pattern on the second mask layer to cover the second region, a portion of the second mask layer in the first region may be etched. After removing the photoresist pattern, portions of the second mask layer on top surfaces of the first masks and a top surface of the intermediate layer in the second region, and top surfaces of the first masks and a top surface of the intermediate layer both in the first and second regions may be etched.

In some example embodiments, when the first and second dummy gate structures are replaced with the first and second gate structures, respectively, a first gate spacer may be formed on both sidewalls of the first dummy gate structure and the first hard mask, and a second gate spacer may be formed on both sidewalls of the second dummy gate structure and the second hard mask. An insulating interlayer may be formed on the active fin and the isolation layer pattern to cover the first and second dummy gate structures, the first and second hard masks, and the first and second gate spacers. The insulating interlayer may be planarized until top surfaces of the first and second dummy gate structures may be exposed. The exposed first and second dummy gate structures may be removed to form first and second openings exposing top surfaces of the active fin and the isolation layer pattern. The first and second gate structures may be formed to fill the first and second openings, respectively.

In some example embodiments, when the insulating interlayer is planarized until the top surfaces of the first and second dummy gate structures may be exposed, the first and second hard masks and upper portions of the first and second gate spacers may be removed.

In some example embodiments, when the first and second gate structures are formed to fill the first and second openings, respectively, a gate insulation layer may be formed on the exposed top surfaces of the active fin and the isolation layer pattern, sidewalls of the first and second openings, top surfaces of the first and second gate spacers, and a top surface of the insulating interlayer. A gate electrode layer may be formed on the gate insulation layer to fill remaining portions of the first and second openings. The gate electrode layer and the gate insulation layer may be planarized until the top surface of the insulating interlayer may be exposed to form a first gate insulation layer pattern and a first gate electrode sequentially stacked in the first opening, and a second gate insulation layer pattern and a second gate electrode sequentially stacked in the second opening.

In some example embodiments, before forming the gate insulation layer, the top surfaces of the active fin exposed by the first and second openings may be thermally oxidized to form first and second interface layer patterns, respectively.

In some example embodiments, the gate insulation layer may include a high-k dielectric material, and the gate electrode layer may include a metal or a metal nitride.

In at least one example embodiment, after forming the first and second gate spacers, a first trench may be formed on a portion of the active fin between the first gate spacers and a second trench may be formed on a portion of the active fin between the second gate spacers. A selective epitaxial growth (SEG) process may be performed to form first and second source/drain layers to fill the first and second trenches, respectively.

In some example embodiments, the first region may be a logic region in which logic devices are formed, and the second region may be a static random access memory (SRAM) region in which SRAM devices are formed.

According to example embodiments, there is provided a method of forming minute patterns. In the method, a third layer, a second layer and a first layer may be sequentially formed on a substrate having first and second regions therein. A plurality of sacrificial patterns may be formed on the first layer in a second direction, and each of the sacrificial patterns extends in a first direction crossing the second direction. Spacers may be formed on both sidewalls of each of the sacrificial patterns. After removing the sacrificial patterns, the first layer may be etched using the spacers as an etching mask to form a plurality of first masks. The second layer may be etched using the first masks as an etching mask to form a plurality of second masks. Third masks may be formed on both sidewalls of each of the second masks in the second direction to define a plurality of fourth masks, and each of the fourth masks may include each of the second masks and the third masks on both sidewalls thereof. The third layer may be etched using the second and fourth masks as an etching mask to form a plurality of first patterns and a plurality of second patterns in the first and second regions, respectively. Each of the first patterns may have a first width in the second direction, and each of the second patterns may have a second width greater than the first width in the second direction.

In some example embodiments, when the third layer, the second layer and the first layer are sequentially formed on the substrate, a fourth layer may be formed between the second layer and the first layer. After forming the first masks, the fourth layer may be etched using the first masks as an etching mask to form a plurality of fifth masks. When the second layer is etched using the first masks as an etching mask to form the plurality of second masks, the second layer may be etched using the fifth masks as an etching mask to form the second masks.

In some example embodiments, when the third masks are formed on both sidewalls of each of the second masks in the second direction, a third mask layer may be formed on the second masks and the third layer. A portion of the third mask layer in the first region may be removed, while a portion of the third mask layer in the second region may remain. A portion of the third mask layer on a top surface of the third layer remaining in the second region may be removed.

In some example embodiments, when the portion of the third mask layer in the first region is removed, while the portion of the third mask layer in the second region remains, a photoresist pattern may be formed on the third mask layer to cover the second region. An etching process may be performed using the photoresist pattern as an etching mask to remove the portion of the third mask layer in the first region.

In some example embodiments, before sequentially forming the third layer, the second layer and the first layer on the substrate, a fifth layer may be formed on the substrate. After etching the third layer using the second and fourth masks as an etching mask to form the plurality of first patterns and the plurality of second patterns in the first and second regions, respectively, the fifth layer may be etched using the first and second patterns as an etching mask to form a plurality of third patterns and a plurality of fourth patterns in the first and second regions, respectively. Each of the third patterns may have the first width in the second direction, and each of the fourth patterns may have the second width in the second direction.

In the method of manufacturing the semiconductor device in accordance with at least one example embodiment, a double patterning process may be performed to form first masks each having the second width on the substrate including the first and second regions, and the second masks may be formed on both sidewalls of each of the first masks in the second region. Thus, the third masks each having the third width greater than the second width may be formed in the second region. Accordingly, the underlying gate layer may be etched using the first and third masks as an etching mask to form gate structures having different widths from each other in different regions.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

FIGS. 11 to 60 are plan views and cross-sectional views illustrating stages of a method of manufacturing a semiconductor device using the method of forming the minute patterns in accordance with example embodiments.

DESCRIPTION OF EMBODIMENTS

Figure 1:
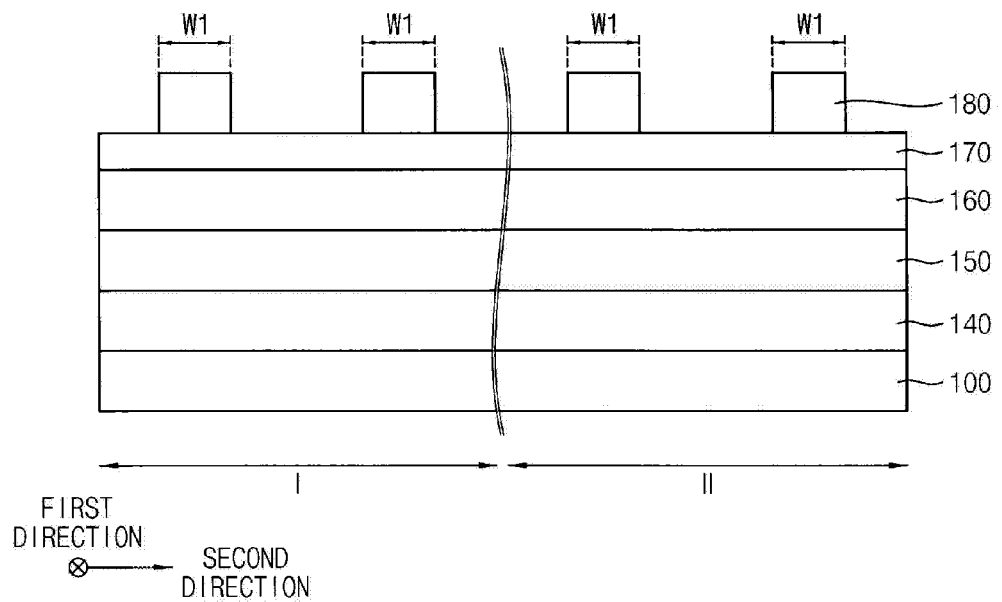
FIGS. 1 to 10 are cross-sectional views illustrating stages of a method of forming minute patterns in accordance with example embodiments.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIGS. 1 to 10 are cross-sectional views illustrating stages of a method of forming minute patterns in accordance with example embodiments.

Referring to FIG. 1, a third etch target layer 140, a second etch target layer 150, a first etch target layer 160, and a first mask layer 170 may be sequentially formed on a substrate 100, and sacrificial patterns 180 may be formed on the first mask layer 170.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

The substrate 100 may include a first region I and a second region II. In some example embodiments, the first region I may serve as a logic region in which logic devices may be formed, and the second region II may serve as a static random access memory (SRAM) region in which SRAM devices may be formed. However, the present inventive concepts may not be limited thereto, and the first region I may be any region in which minute patterns having a relatively small width may be formed, and the second region II may be any region in which minute patterns having a relatively large width may be formed.

The third etch target layer 140 may include, e.g., polysilicon, or doped polysilicon, the second etch target layer 150 may include a nitride, e.g., silicon nitride, the first etch target layer 160 may include, e.g., polysilicon, and the first mask layer 170 may include a nitride, e.g., silicon nitride. However, the present inventive concepts may not be limited thereto. In some example embodiments, the first etch target layer 160 may include various materials having an etch selectivity with respect to the first mask layer 170 and the second etch target layer 150, and the third etch target layer 140 may include various materials having an etch selectivity with respect to the second etch target layer 150.

The sacrificial patterns 180 may be formed by forming a sacrificial layer on the first mask layer 170, forming a second photoresist pattern on the sacrificial layer, and etching the sacrificial layer using the second photoresist pattern as an etching mask. The sacrificial layer may include, e.g., polysilicon, amorphous carbon layer (ACL), spin-on organic hardmask (SOH), etc.

Each of the sacrificial patterns 180 may be formed to extend in a first direction substantially parallel to a top surface of the substrate 100, and the sacrificial patterns 180 may be formed to be spaced apart from each other in a second direction substantially parallel to the top surface of the substrate and crossing the first direction. The sacrificial patterns 180 may be formed to be spaced apart from each other at a constant distance. The first and second directions may be substantially perpendicular to each other.

Each of the sacrificial patterns 180 may be formed to have a first width W1 in the second direction, and the first width W1 may be equal to or more than about 20 nm due to the limitation of a photolithography process.

Figure 2:
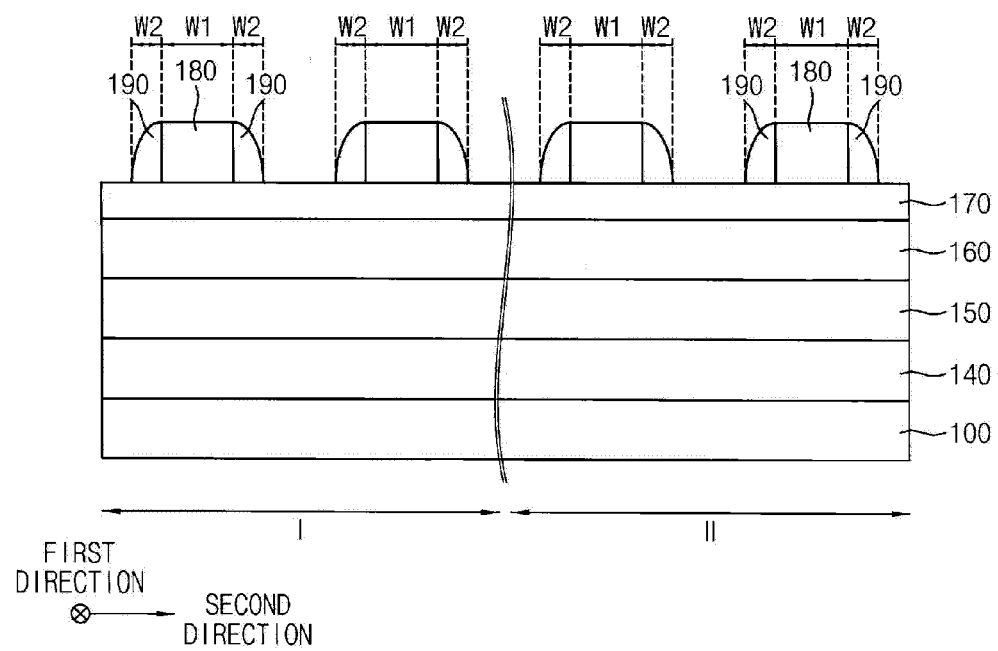

Referring to FIG. 2, spacers 190 may be formed on both sidewalls of each of the sacrificial patterns 180 in the second direction.

The spacers 190 may be formed by conformally forming a spacer layer covering the sacrificial patterns 180 on the first mask layer 170 and anisotropically etching the spacer layer. Each of the spacers 190 may be formed to have a second width W2 in the second direction. In at least one example embodiment, the second width W2 may be less than the first width W1. For example, the second width W2 may be equal to or less than about 20 nm.

The spacer layer may be formed by an atomic layer deposition (ALD) process using an oxide.

Figure 3:
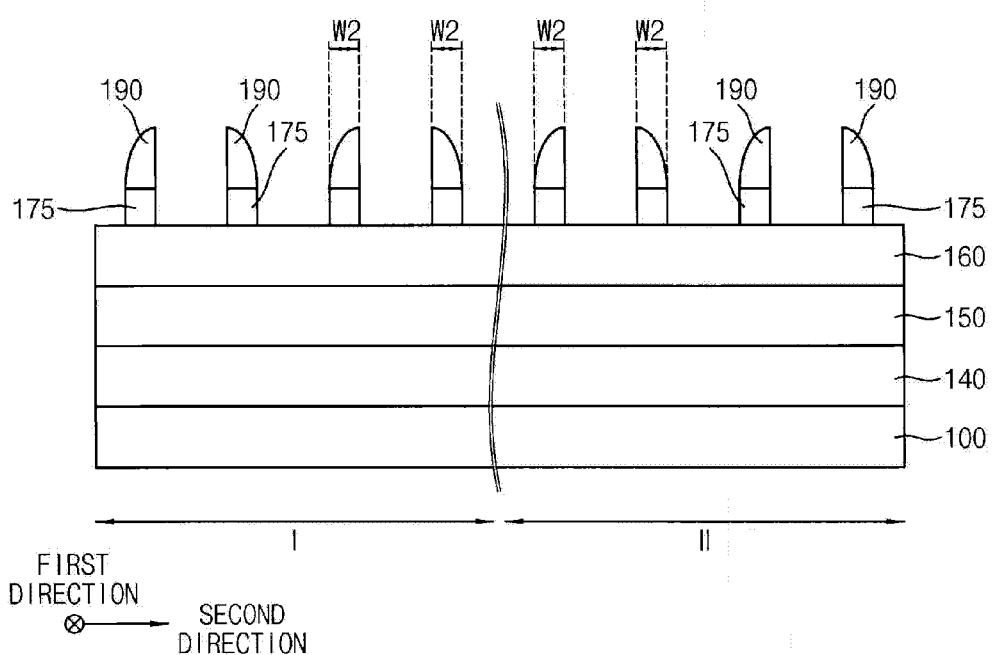

Referring to FIG. 3, after removing the sacrificial patterns 180, the first mask layer 170 may be etched using the spacers 190 as an etching mask to form first masks 175.

The sacrificial patterns 180 may be removed by a wet etching process or a dry etching process and the first mask layer 170 may be etched by a dry etching process.

Each of the first masks 175 may be formed to extend in the first direction, and the first masks 175 may be disposed in the second direction. Each of the first masks 175 may be formed to have the second width W2 in the second direction.

Figure 4:
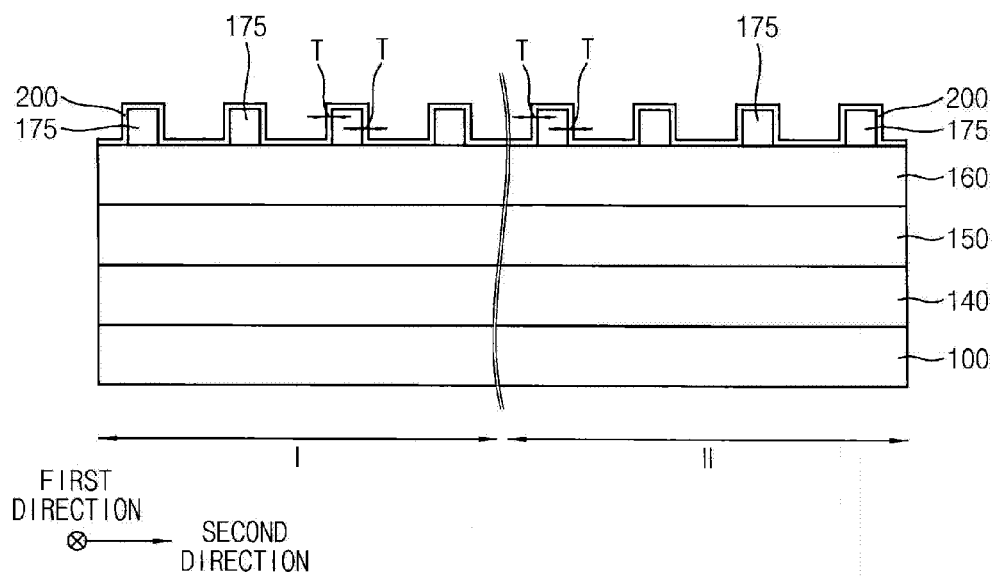

Referring to FIG. 4, after removing the spacers 190, a second mask layer 200 may be formed on the first masks 175 and the first etch target layer 160.

The second mask layer 200 may be conformally formed to have a constant thickness T. The thickness T may be less than the second width W2. For example, the thickness T may be equal to or less than about 5 nm.

The second mask layer 200 may be formed of a material having an etch selectivity with respect to the first masks 175, e.g., an oxide. The second mask layer 200 may be formed by an ALD process.

Figure 5:
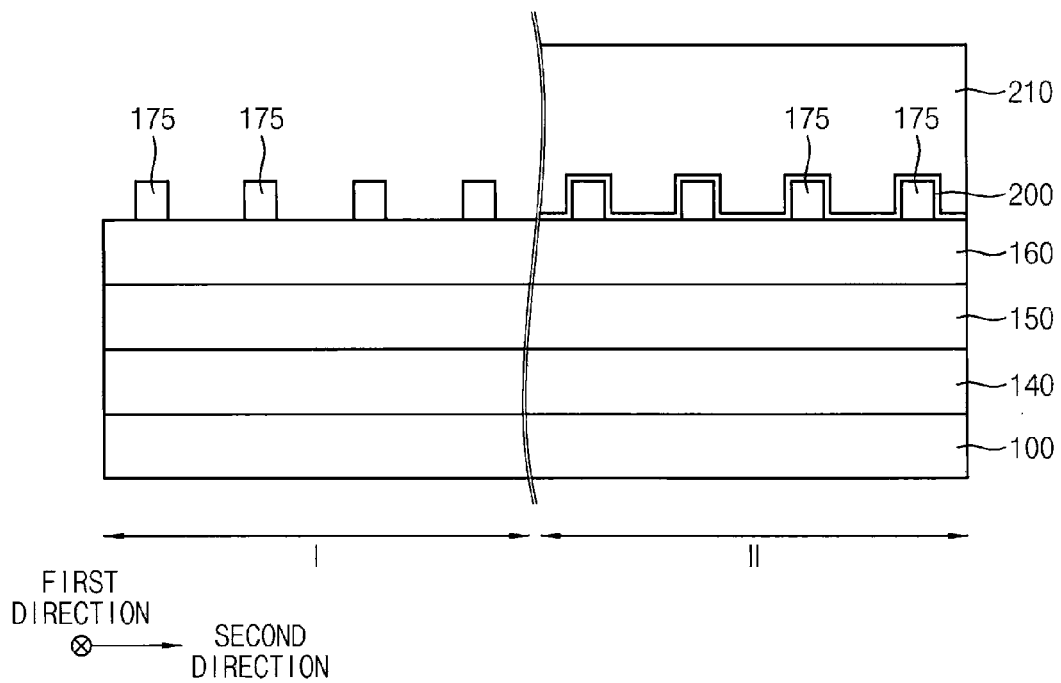

Referring to FIG. 5, a first photoresist pattern 210 may be formed on the second mask layer 200 to cover the second region II, and a portion of the second mask layer 200 in the first region I may be removed.

The portion of the second mask layer 200 in the first region I may be removed by a wet etching process, and thus the first masks 175 and a portion of the first etch target layer 160 therebetween in the first region I may be exposed. In some embodiments, the portion of the second mask layer 200 in the first region I may be removed by a dry etching process.

Figure 6:
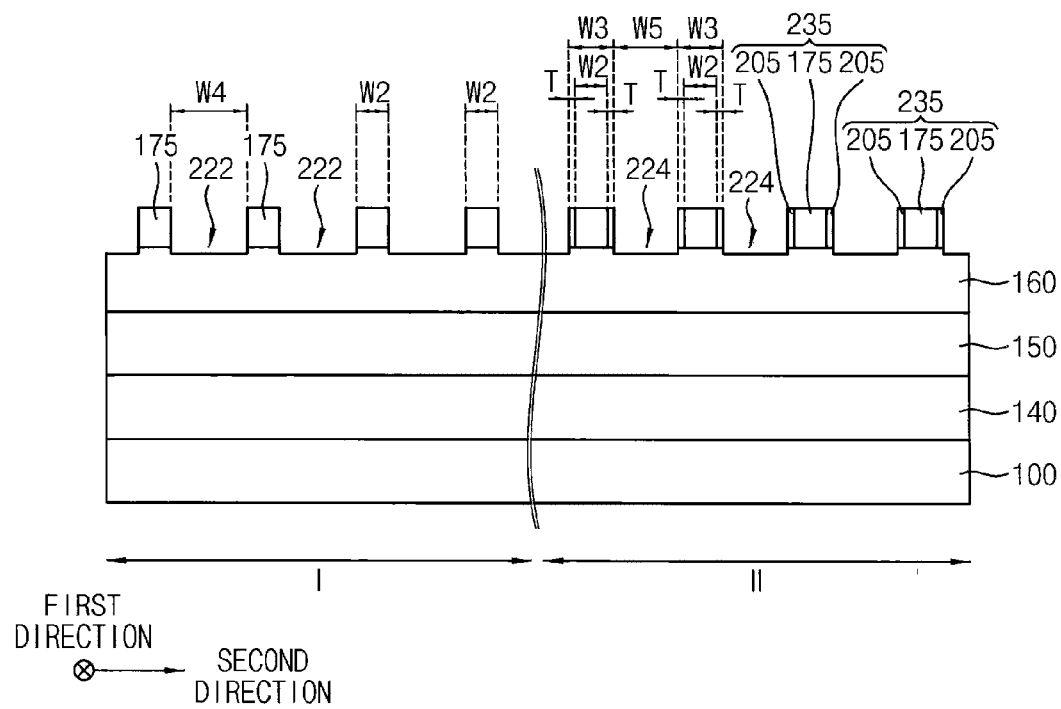

Referring to FIG. 6, after removing the first photoresist pattern 210, a portion of the second mask layer 200 remaining in the second region II may be partially removed to form second masks 205 on both sidewalls of each of the first masks 175 in the second direction. Hereinafter, a structure including each first mask 175 and the second masks 205 on both sidewalls of each first mask 175 in the second region II may be referred to as a third mask 235. The third mask 235 may have a third width W3 in the second direction that may be equal to a sum of the second width W2 and twice the thickness T, and thus may have a width greater than that of the first mask 175.

The second mask layer 200 may be etched by a dry etching process using fluorocarbon (CxFy) gas as an etching gas to form the second masks 205 on both sidewalls of each first mask 175. In the second region II, not only a portion of the second mask layer 200 on a top surface of each first mask 175 but also a portion of the second mask layer 200 on a top surface of the first etch target layer 160 between the first masks 175 may be etched to expose the top surface of each first mask 175 and the top surface of the first etch target layer 160.

The dry etching process may be further performed to at least partially remove the exposed top surfaces of the first masks 175 and the exposed top surface of the first etch target layer 160 between the third masks 235 in the second region II, and also top surfaces of the first masks 175 and a top surface of the first etch target layer 160 between the first masks 175 in the first region I. Thus, a first recess 222 having a fourth width W4 in the second direction may be formed on a portion of the first etch target layer 160 between the first masks 175 in the first region I, and a second recess 224 having a fifth width W5 in the second direction less than the fourth width W4 may be formed on a portion of the first etch target layer 160 between the third masks 235 in the second region II.

Figure 7:
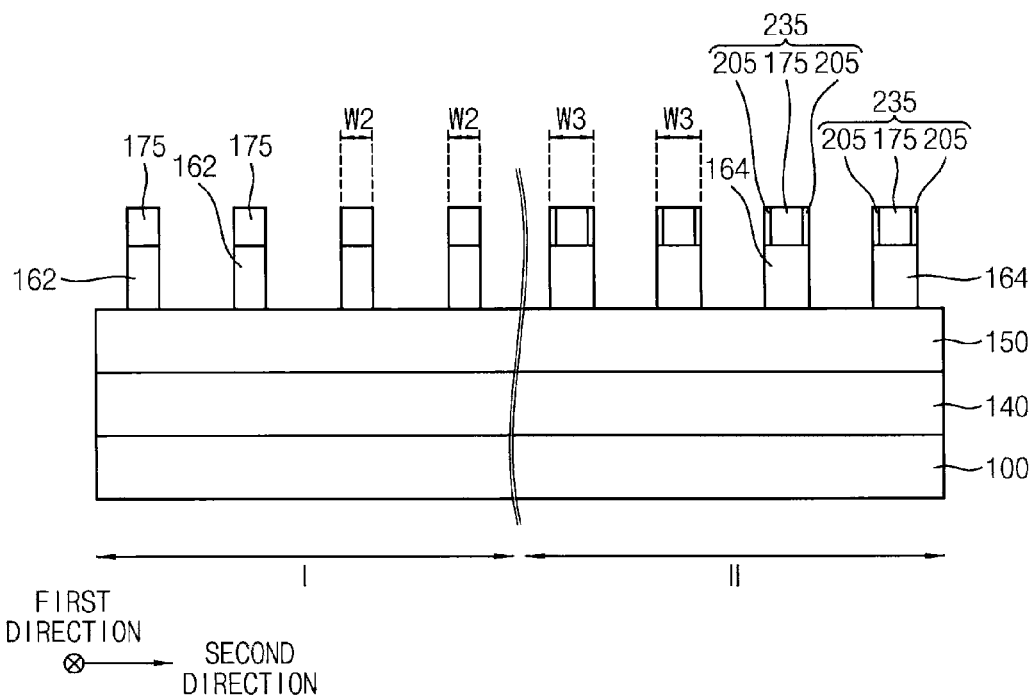

Referring to FIG. 7, the first etch target layer 160 may be etched using the first and third masks 175 and 235 as an etching mask to form first and second patterns 162 and 164 in the first and second regions I and II, respectively.

The first etch target layer 160 may be etched until a top surface of the second etch target layer 150 may be exposed by a dry etching process using hydrogen bromide (HBr) gas and oxygen (O$_2$) gas as an etching gas. Each of the first and second patterns 162 and 164 may be formed to extend in the first direction, and the first and second patterns 162 and 164 may have the second and third widths W2 and W3, respectively, in the second direction.

Figure 8:
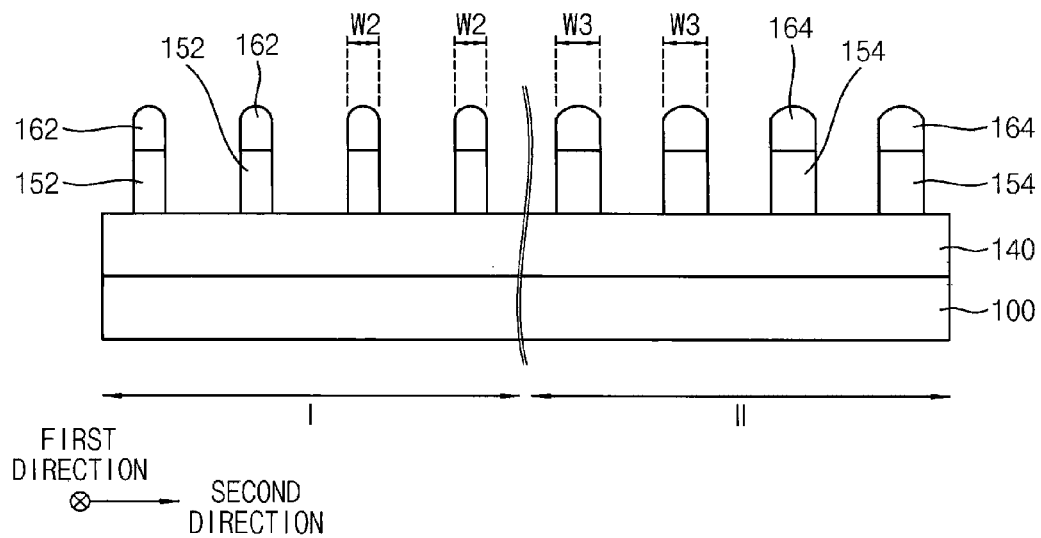

Referring to FIG. 8, a portion of the second etch target layer 150 between first pattern structures each including the first pattern 162 and the first mask 175 sequentially stacked and a portion of the second etch target layer 150 between second pattern structures each including the second pattern 164 and the third mask 235 sequentially stacked may be etched.

A dry etching process may be performed using a gas that may commonly etch the first and third masks 175 and 235 and the second etch target layer 150 so that the first and third masks 175 and 235 may be removed and the second etch target layer 150 may be partially etched to form third and fourth patterns 152 and 154. After the first and third masks 175 and 235 may be removed, exposed upper portions of the first and second patterns 162 and 164 may be partially removed.

Each of the third and fourth patterns 152 and 154 may be formed to extend in the first direction in the first and second regions I and II, respectively, and the third and fourth patterns 152 and 154 may be formed to have the second and third widths W2 and W3, respectively, in the second direction.

Figure 9:
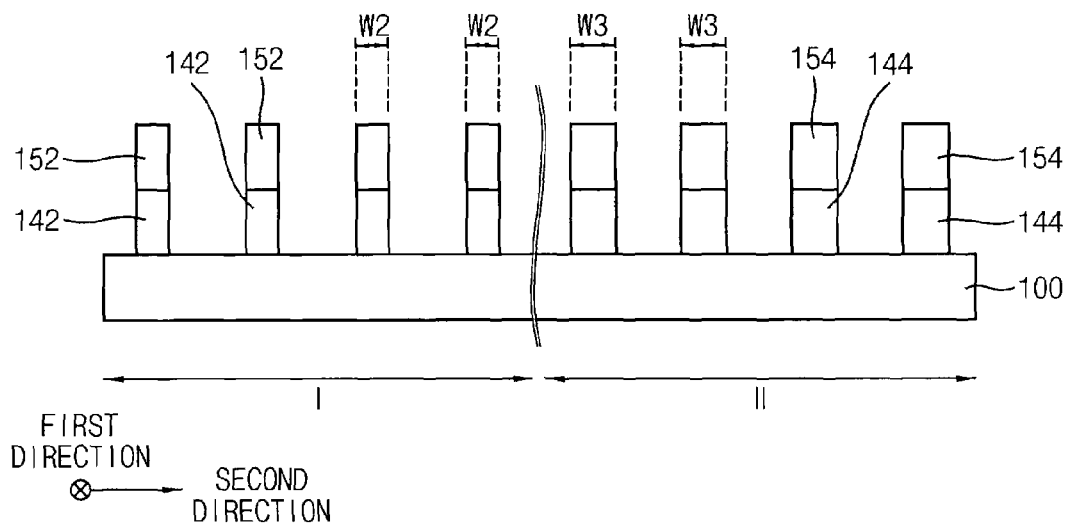

Referring to FIG. 9, the third etch target layer 140 may be etched using the third and fourth patterns 152 and 154 as an etching mask to form fifth and sixth patterns 142 and 144 in the first and second regions I and II, respectively.

The third etch target layer 140 may be etched until a top surface of the substrate 100 may be exposed by a dry etching process using hydrogen bromide (HBr) gas and oxygen (O$_2$) gas as an etching gas. Each of the fifth and sixth patterns 142 and 144 may be formed to extend in the first direction, and the fifth and sixth patterns 142 and 144 may be formed to have the second and third widths W2 and W3, respectively, in the second direction. In the dry etching process, the first and second patterns 162 and 164 may be removed.

Figure 10:
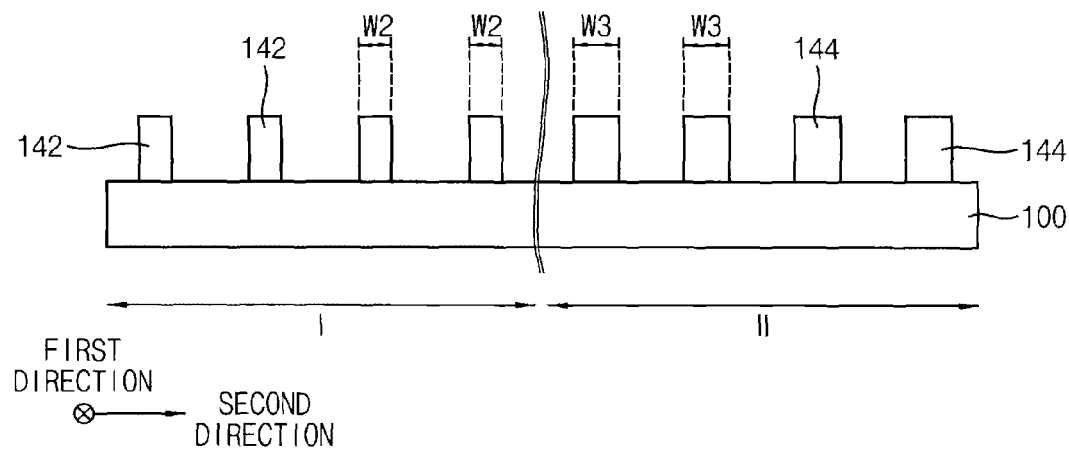

Referring to FIG. 10, the third and fourth patterns 152 and 154 may be removed to finally form the fifth and sixth patterns 142 and 144 on the substrate 100.

As illustrated above, in the method of forming the minute patterns in accordance with at least one example embodiment, after forming the sacrificial patterns 180 to have the first width W1 by a single patterning process, the spacers 190 may be formed on both sidewalls of each of the sacrificial patterns 180 to have the second width W2 less than the first width W1 by a double patterning process, and the first mask layer 170 may be etched using the spacers 190 as an etching mask to form the first masks 175, each of which has the second width W2.

The second mask layer 200 having the thin thickness T may be formed on the first etch target layer 160 to cover the first masks 175, the portion of the second mask layer 200 in the first region I may be removed, and the portion of the second mask layer 200 may be partially removed to form the second masks 205 on both sidewalls of each of the first masks 175. Thus, each first mask 175 and the second masks 205 on both sidewalls of each first mask 175 may form the third mask 235 in the second region II, which may have the third width W3 greater than the second width W2 of each first mask 175 in the first region I.

The first etch target layer 160 may be etched using the first and third masks 175 and 235 as an etching mask to form the first and second patterns 162 and 164 having the second and third widths W2 and W3, respectively, in the first and second regions I and II, respectively. That is, minute patterns having different widths in different regions, each of which may be less than the width obtained by a single patterning process, may be formed.

In As, the sacrificial patterns 180 serving as a mandrel in the double patterning process may be removed before etching the first mask layer 170 using the spacers 190 as an etching mask, the sacrificial patterns 180 may be formed using various materials regardless of the materials of the first etch target layer 160, which may be formed under the first mask layer 170 and patterned to form the first and second patterns 162 and 164. Accordingly, the sacrificial patterns 180 may be formed polysilicon or other materials (e.g., ACL, SOH, etc.).

Each third mask 235 may be formed to include each first mask 175 and the second masks 205 on both sidewall of each first mask 175 in the second direction, which may be symmetric with respect to each first mask 175, in the second region II, and thus may have the third width W3 greater than the second width W2 of each first mask 175. When the first masks 175 are spaced apart from each other at a constant distance in the second direction, the third masks 235 may be also spaced apart from each other at a constant distance in the second direction. The distance between the third masks 235 may be less than the distance between the first masks 175.

Up to now, the first and second patterns 162 and 164, the third and fourth patterns 152 and 154, and the fifth and sixth patterns 142 and 144 may be formed by patterning the first, second and third etch target layers 160, 150 and 140, respectively, however, the present inventive concepts may not be limited thereto, and etch target layers may be added or omitted according to the location and/or material of the minute patterns. That is, in the present inventive concepts, only some of the first to third etch target layers 160, 150 and 140 may be formed on the substrate 100 to form minute patterns, or a fourth etch target layer may be further formed between the substrate 100 and the third etch target layer 140 to form minute patterns.

In some example embodiments, the first to third etch target layers 160, 150 and 140 may include polysilicon, silicon nitride, and polysilicon, respectively, and thus the third and fourth patterns 152 and 154 may serve as a hard mask, and the fifth and sixth patterns 142 and 144 may serve as a dummy gate structure. The first etch target layer 160 may serve as an intermediate layer between the second etch target layer 150 and the first mask layer 170.

In other example embodiments, the third etch target layer 140 may include doped polysilicon, a metal, and/or a metal nitride, and in this case, the fifth and sixth patterns 142 and 144 may serve as a real gate structure.

In other example embodiments, the third etch target layer 140 may not be formed on the substrate 100, and the substrate 100 may be etched using the third and fourth patterns 152 and 154 as an etching mask. In this case, active fins having different widths in different regions may be formed on the substrate 100.

Up to now, the second mask layer 200 having the thin thickness may be formed to cover the first masks 175 contacting bottom surfaces of the spacers 190, which may be formed on both sidewalls of the sacrificial patterns 180 used in a double patterning process, and portions of the second mask layer 200 on both sidewalls of each of the first masks 175 may partially remain to form the second masks 205. Accordingly, the first and third masks 175 and 235 having different widths in different regions may be obtained, and underlying layers may be patterned using the first and third masks 175 and 235 as an etching mask. However, the present inventive concepts may not be limited thereto. For example, instead that the second mask layer 200 covers the first masks 175, underlying layers may be patterned using the first masks 175 as an etching mask to form pattern structures each having a constant width regardless of the regions, the second mask layer 200 may be formed to cover sidewalls of the pattern structures, and the second mask layer 200 may remain on both sidewalls of each of the pattern structures only in a specific region to form the second masks 205. Accordingly, masks having different widths in different regions may be obtained, and underlying layers may be patterned using the masks as an etching mask.

That is, the masks having the different widths in different regions may not be formed by pattern structures formed by patterning a layer directly beneath the spacers 190 that may be formed by a double patterning process, and may be also formed by any other layers under the spacers 190.

Hereinafter, the third etch target layer 140 serving as a dummy gate layer structure of a fin-type field effect transistor (finFET) will be illustrated.

FIGS. 11 to 60 are plan views and cross-sectional views illustrating stages of a method of manufacturing a semiconductor device using the method of forming the minute patterns in accordance with example embodiments. Particularly, FIGS. 11, 13, 15, 18, 20, 22, 24, 26, 28, 30, 32, 36, 39, 42, 45, 48, 51, 54 and 57 are plan views, and FIGS. 12, 14, 16, 17, 19, 21, 23, 25, 27, 29, 31, 33-35, 37-38, 40-41, 43-44, 46-47, 49-50, 52-53, 55-56 and 58-60 are cross-sectional views.

FIGS. 17, 19, 21, 23, 25, 27, 29, 31, 33, 37, 40, 43, 46, 49, 52, 55 and 58 are cross-sectional views taken along a line A-A' of corresponding plan views, FIGS. 12, 14, 16, 34, 38, 41, 44, 47, 56 and 59 are cross-sectional views taken along a line B-B' of corresponding plan views, and FIGS. 35, 50, 53 and 60 are cross-sectional views taken along a line C-C' of corresponding plan views.

The method of manufacturing the semiconductor device may include processes substantially the same as or similar to those illustrated with reference to FIGS. 1 to 10, and detailed descriptions thereon are omitted herein.

Figure 11:
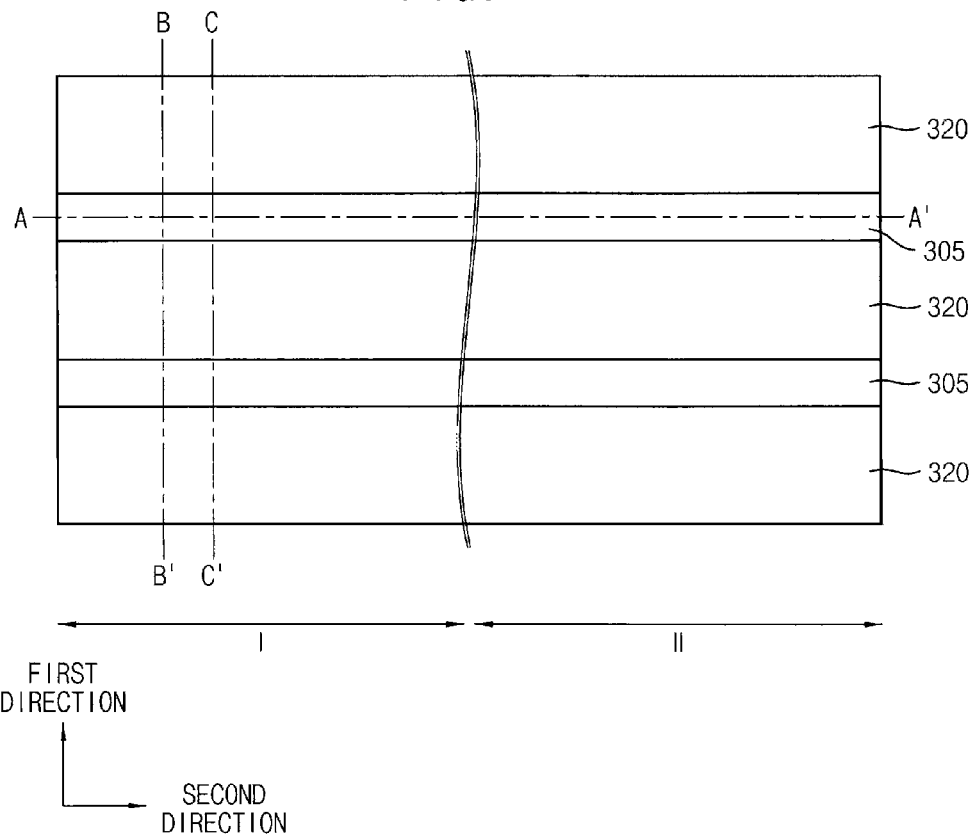
Figure 12:
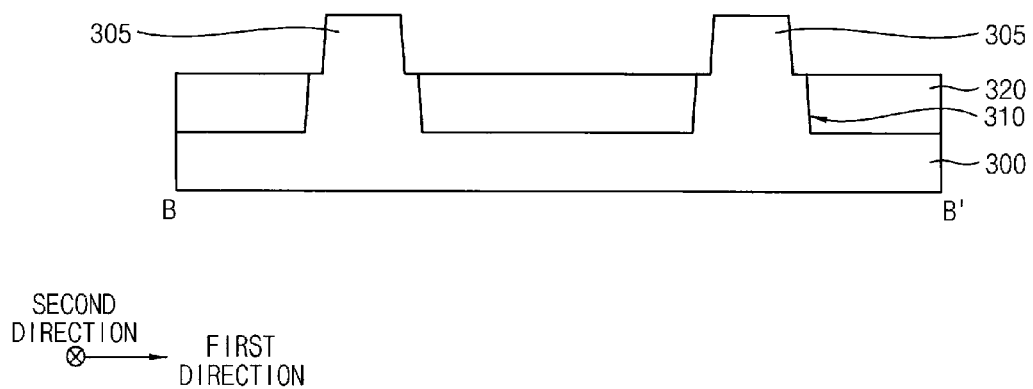

Referring to FIGS. 11 and 12, an upper portion of the substrate 300 may be partially etched to form a first trench 310, and an isolation layer pattern 320 may be formed to fill a lower portion of the first trench 310.

The substrate 300 may include silicon, germanium, silicon-germanium, or III-V semiconductor compounds, e.g., GaP, GaAs, GaSb, etc. In some example embodiments, the substrate 300 may be a silicon-on-insulator (SOI) substrate or a germanium-on-insulator (GOI) substrate.

The substrate 300 may include a first region I and a second region II. In some example embodiment, the first region I may serve as a logic region in which logic devices may be formed, and the second region II may serve as a SRAM region in which SRAM devices may be formed. However, the present inventive concepts may not be limited thereto, and the first region I may be any region in which minute patterns having a relatively small width may be formed, and the second region II may be any region in which minute patterns having a relatively large width may be formed. For example, in the same memory cell region, in the same peripheral circuit region, or in the same logic region, a portion thereof in which gate structures having a relatively small width are formed may be defined as the first region I, and a portion thereof in which gate structures having a relatively large width are formed may be defined as the second region II.

In some example embodiment, the isolation layer pattern 320 may be formed by forming an isolation layer on the substrate 300 to sufficiently fill the first trench 310, planarizing the isolation layer until a top surface of the substrate 300 may be exposed, and removing an upper portion of the isolation layer to expose an upper portion of the first trench 310. The isolation layer may include an oxide, e.g., silicon oxide.

An active region having a top surface not covered by the isolation layer pattern 320 may be defined on the substrate 300. The active region may have a fin-like shape protruding from the substrate 300, and thus may be referred to as an active fin 305.

When the upper portion of the isolation layer is removed, an upper portion of the substrate 300 adjacent thereto may be also removed. Thus, a lower portion of the active fin 305 whose a sidewall is covered by the isolation layer pattern 320 may have a width greater than a width of an upper portion of the active fin 305 whose a sidewall is not covered by the isolation layer pattern 320. An upper portion of the active fin 305 may protrude above a top surface of the isolation layer pattern 320

The active fin 305 may extend in a second direction substantially parallel to a top surface of the substrate 300, and a plurality of active fins 305 may be disposed in a first direction substantially parallel to the top surface of the substrate 300 and crossing the second direction. The first and second directions may cross each other at a right angle.

Figure 13:
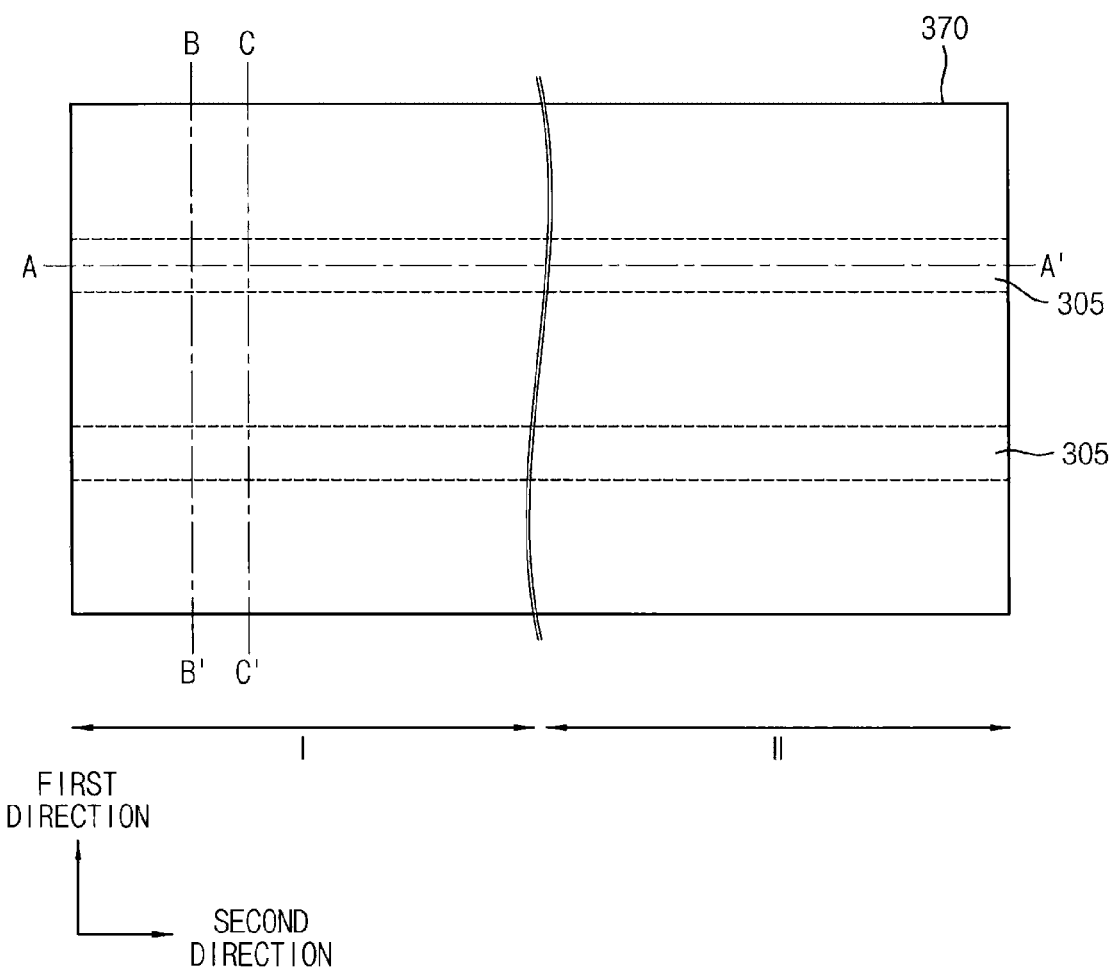
Figure 14:
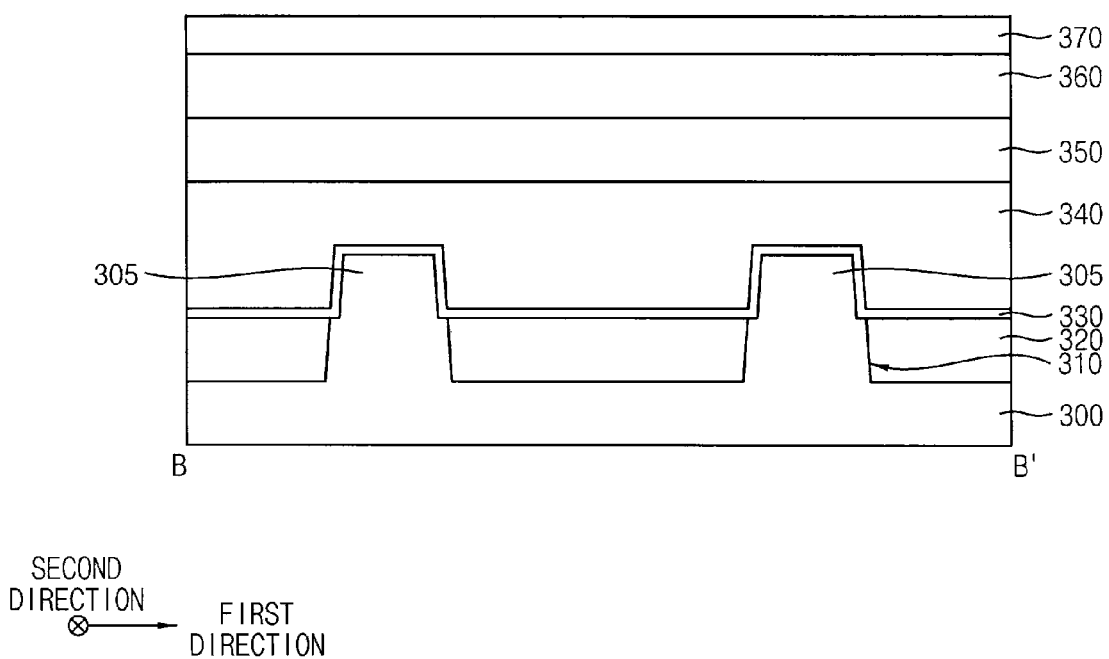

Referring to FIGS. 13 to 14, a dummy gate layer structure including a dummy gate insulation layer 330 and a dummy gate electrode layer 340, a hard mask layer 350, an intermediate layer 360, and a first mask layer 370 may be sequentially formed on the substrate 300 having the isolation layer pattern 320 thereon.

The dummy gate insulation layer 330 may include an oxide, for example, silicon oxide, the dummy gate electrode layer 340 may include, for example, polysilicon, the hard mask layer 350 may be include a nitride, for example silicon nitride, the intermediate layer 360 may include, for example, polysilicon, and the first mask layer 370 may include a nitride, for example, silicon nitride. However, the present inventive concepts may not be limited thereto. In at least one example embodiment, the intermediate layer 360 may include various materials having an etch selectivity with respect to the first mask layer 370 and the hard mask layer 350, and the dummy gate electrode layer 340 may include various materials having an etch selectivity with respect to the hard mask layer 350.

The dummy gate insulation layer 330 may be formed by a chemical vapor deposition (CVD) process, an atomic layer deposition (ALD) process, or the like. Alternatively, the dummy gate insulation layer 330 may be formed by a thermal oxidation process on an upper portion of the substrate 300, and in this case, the dummy gate insulation layer 330 may not be formed on the isolation layer pattern 320. The dummy gate electrode layer 340, the hard mask layer 350, the intermediate layer 360, and the first mask layer 370 may be also formed by a CVD process, an ALD process, etc.

Figure 15:
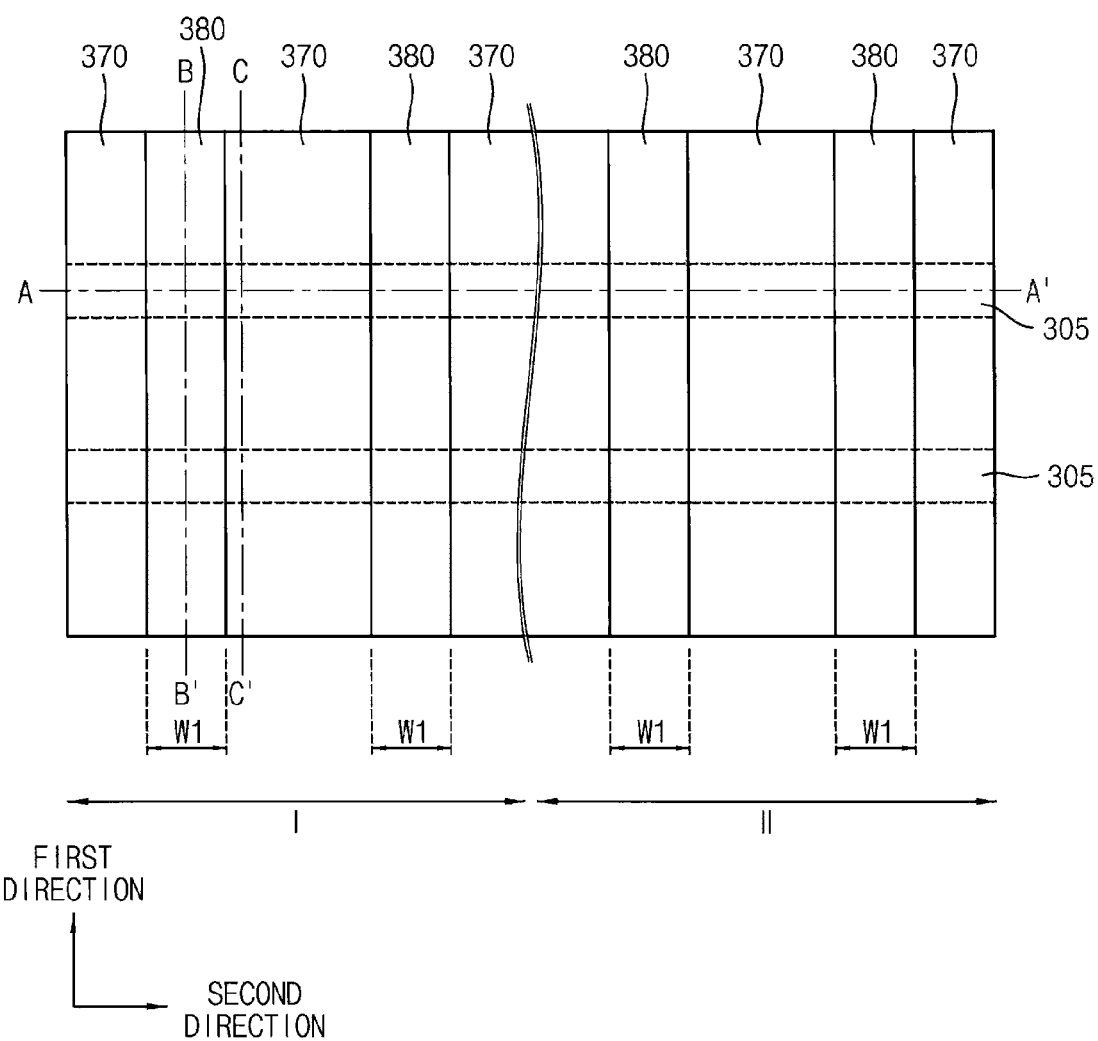
Figure 16:
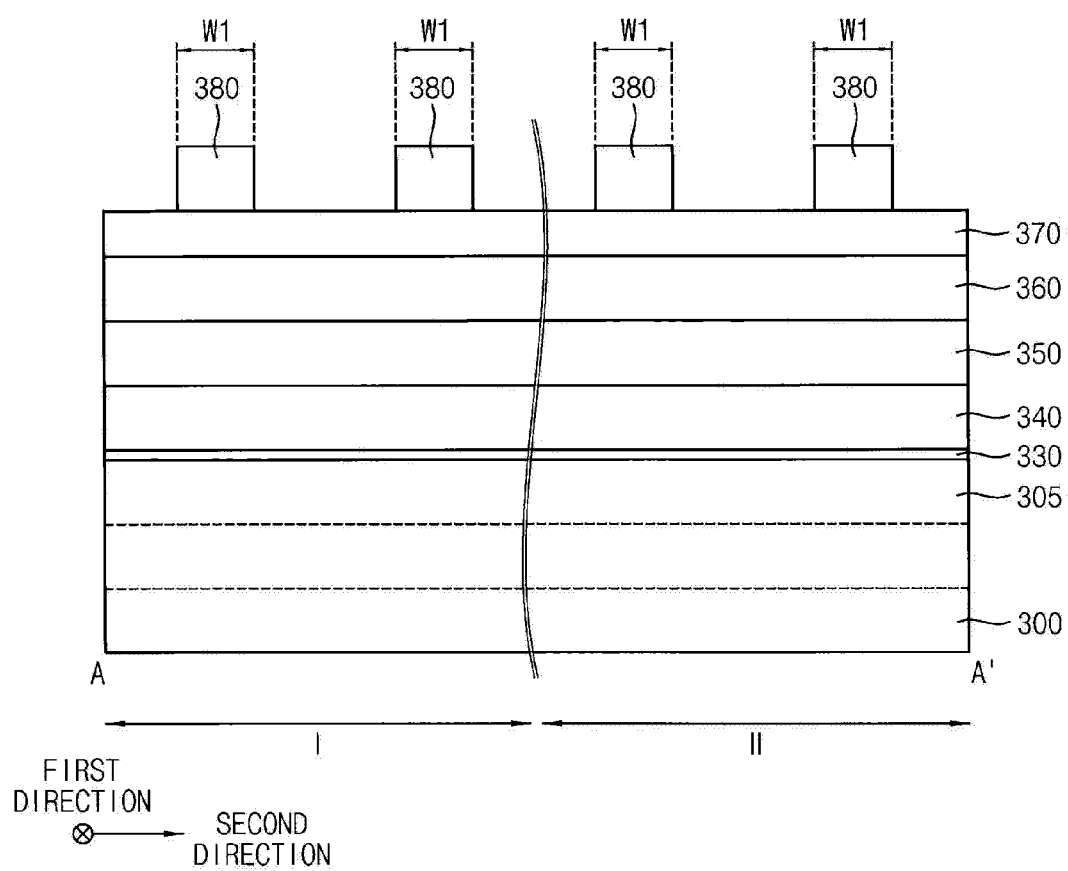
Figure 17:
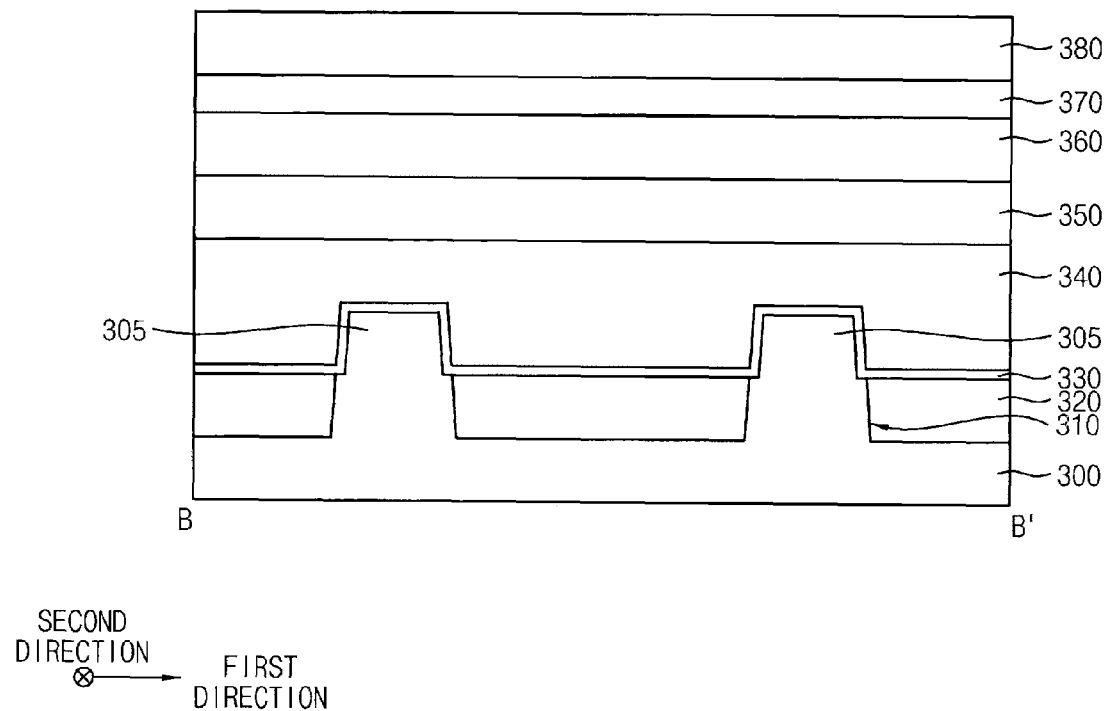

Referring to FIGS. 15 and 17, a process substantially the same as or similar to that illustrated with reference to FIG. 1 may be performed so that sacrificial patterns 380 each extending in the first direction may be formed on the first mask layer 370 to be arranged in the second direction.

The sacrificial patterns 380 each having a first width W1 in the second direction may be formed to be spaced apart from each other in the second direction. Each of the sacrificial patterns 380 may include, e.g., polysilicon, ACL, SOH, etc.

Figure 18:
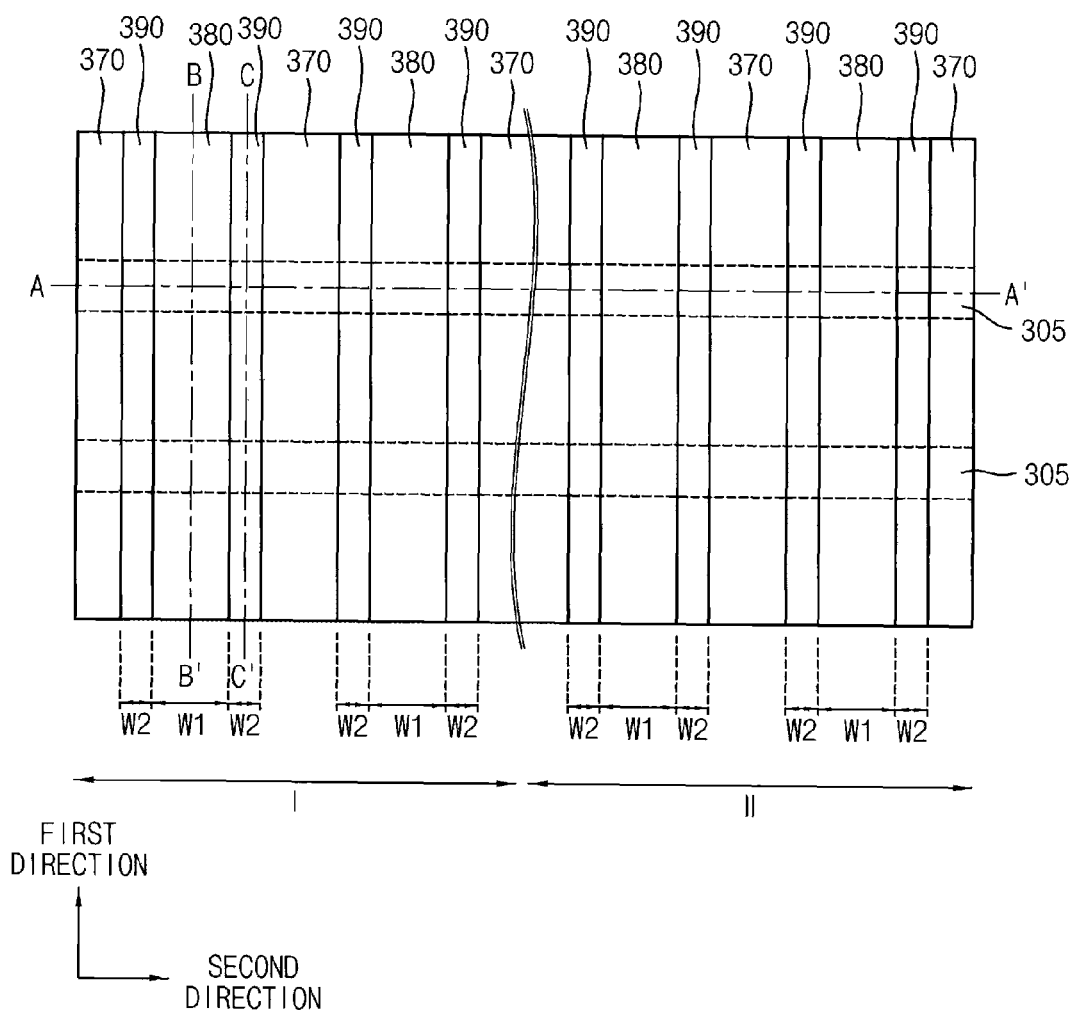
Figure 19:
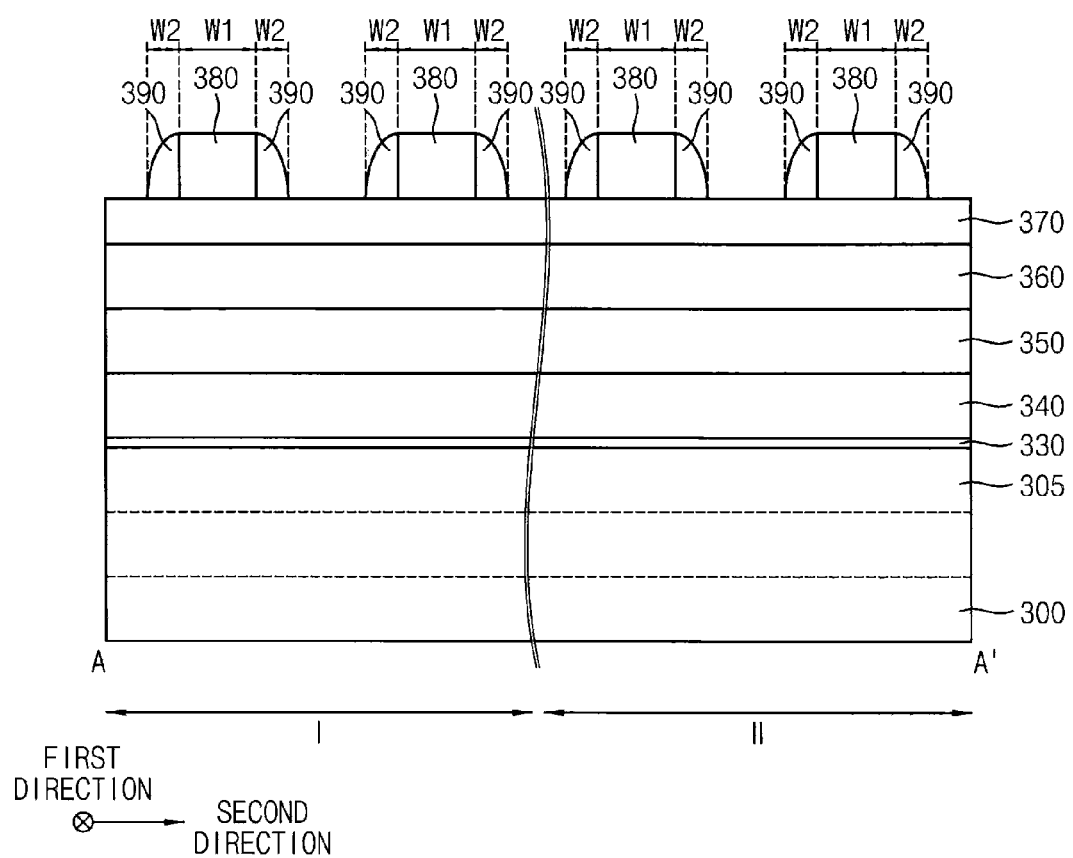

Referring to FIGS. 18 and 19, a process substantially the same as or similar to that illustrated with reference to FIG. 2 may be performed so that spacers 390 may be formed on both sidewalls of each of the sacrificial patterns 380 in the second direction.

Each of the spacers 390 may be formed to have a second width W2 in the second direction, which may be less than the first width W1. Each of the spacers 390 may include ALD oxide.

Figure 20:
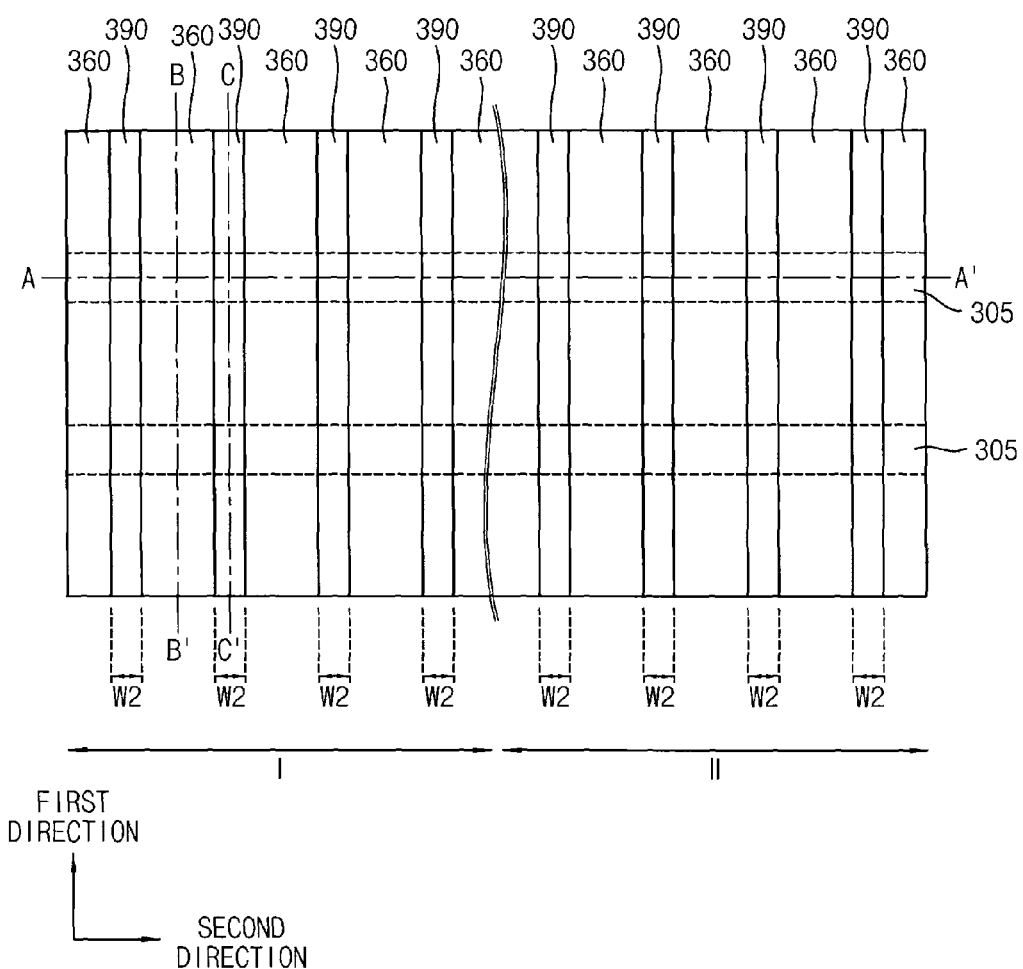
Figure 21:
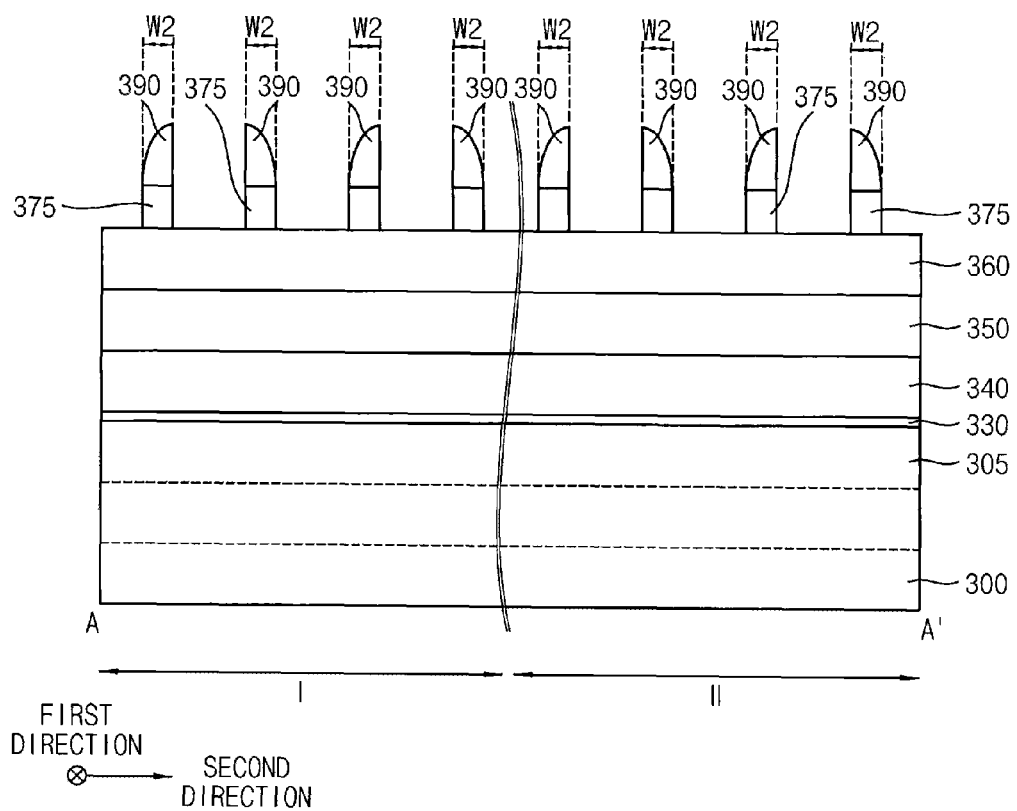

Referring to FIGS. 20 and 21, a process substantially the same as or similar to that illustrated with reference to FIG. 3 may be performed. Thus, after removing the sacrificial patterns 380, the first mask layer 370 may be etched using the spacers 390 as an etching mask to form first masks 375.

Each of the first masks 375 may be formed to extend in the first direction, and the first masks 375 may be disposed in the second direction. Each of the first masks 375 may have the second width W2 in the second direction.

Figure 22:
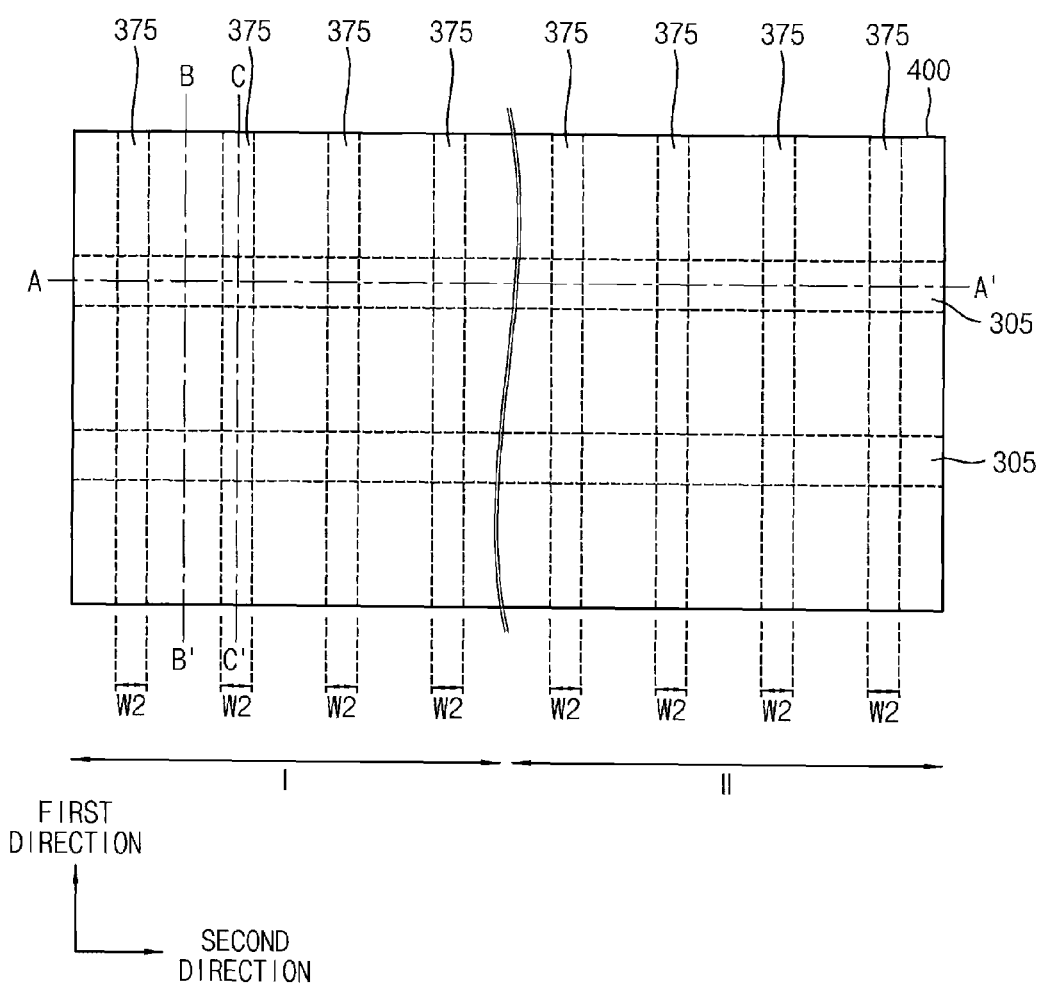
Figure 23:
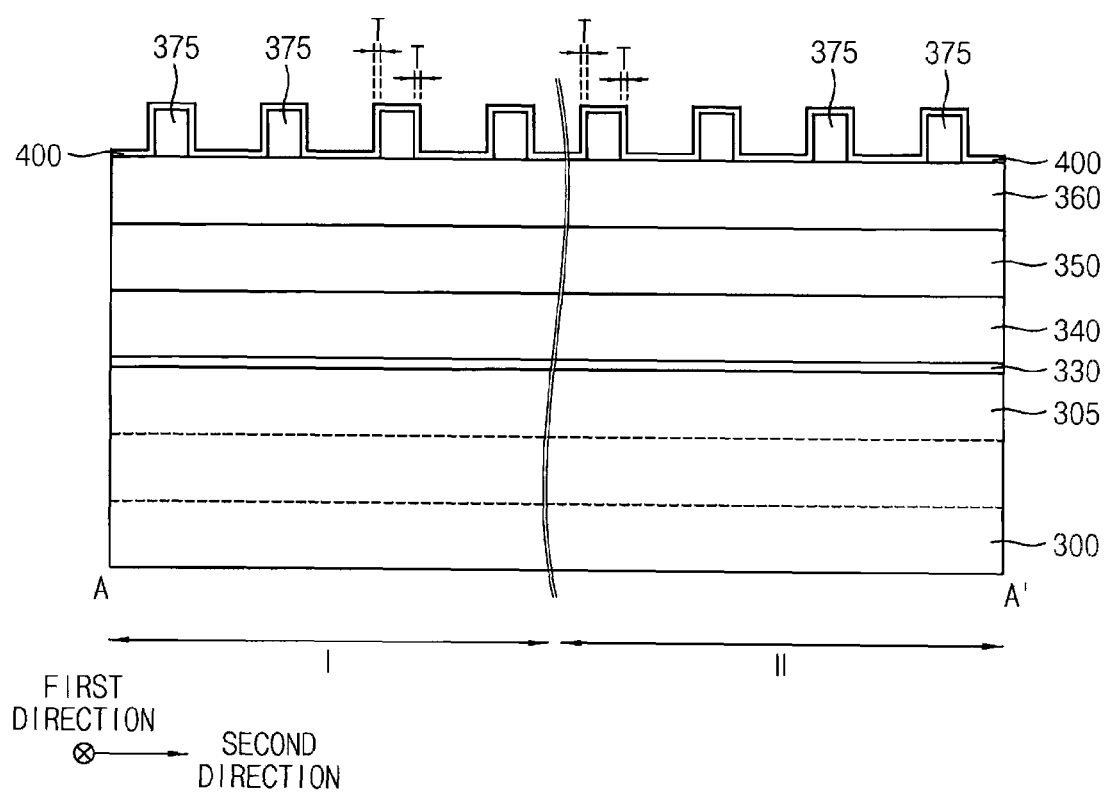

Referring to FIGS. 22 and 23, a process substantially the same as or similar to that illustrated with reference to FIG. 4 may be performed. Thus, a second mask layer 400 may be formed on the first masks 375 and the intermediate layer 360.

The second mask layer 400 having a thin thickness T less than the second width W2 may be conformally formed. The second mask layer 400 may be formed using a material having an etch selectivity with respect to the first masks 375, e.g., an oxide by an ALD process.

Figure 24:
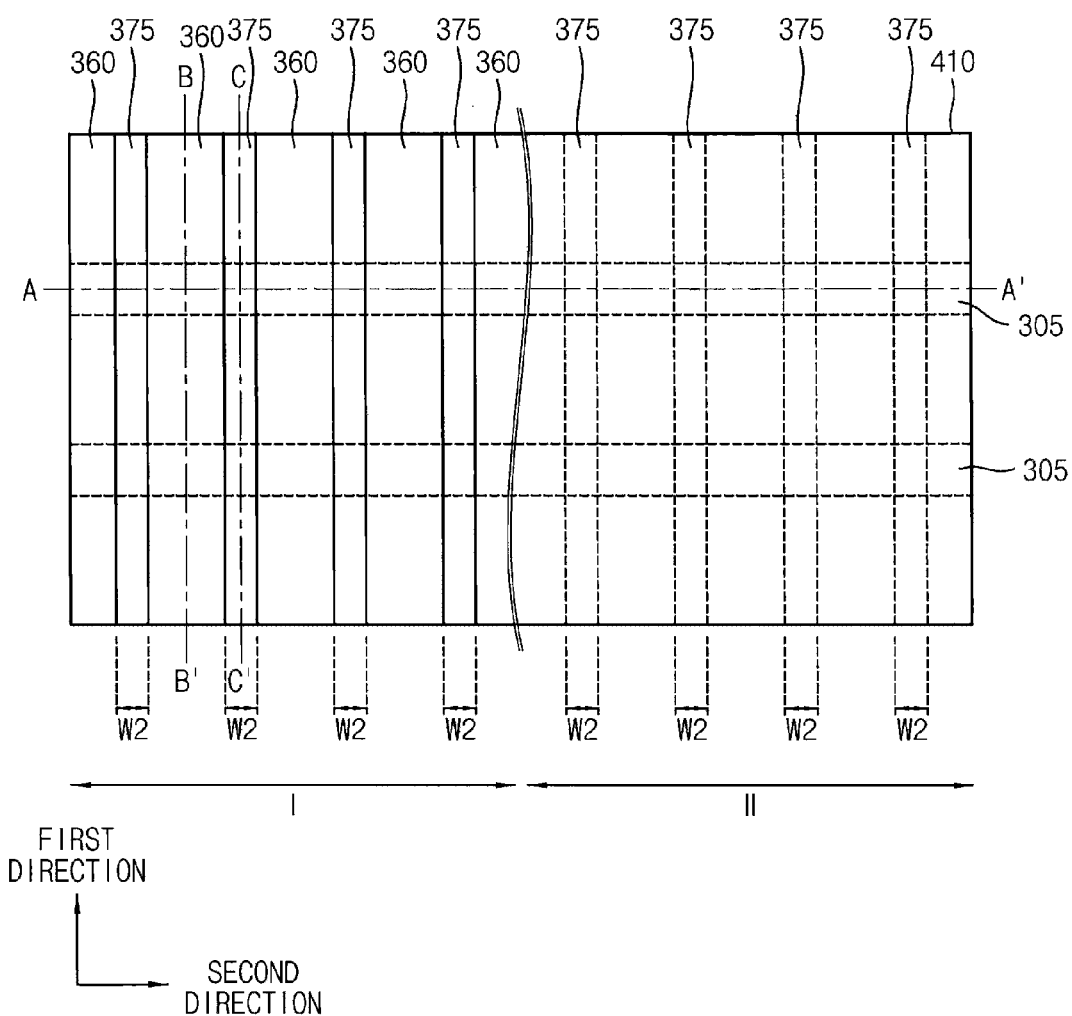
Figure 25:
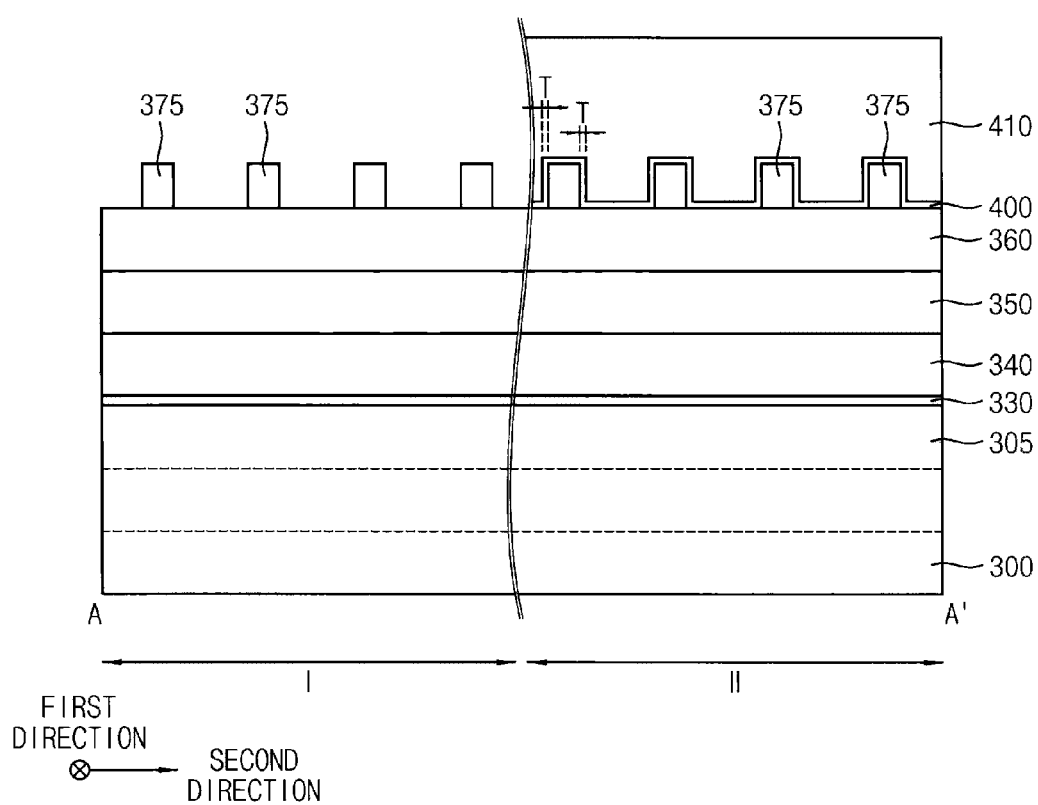

Referring to FIGS. 24 and 25, a process substantially the same as or similar to that illustrated with reference to FIG. 5 may be performed. Thus, a first photoresist pattern 410 covering the second region II may be formed on the second mask layer 400, and a portion of the second mask layer 400 in the first region I may be removed.

Figure 26:
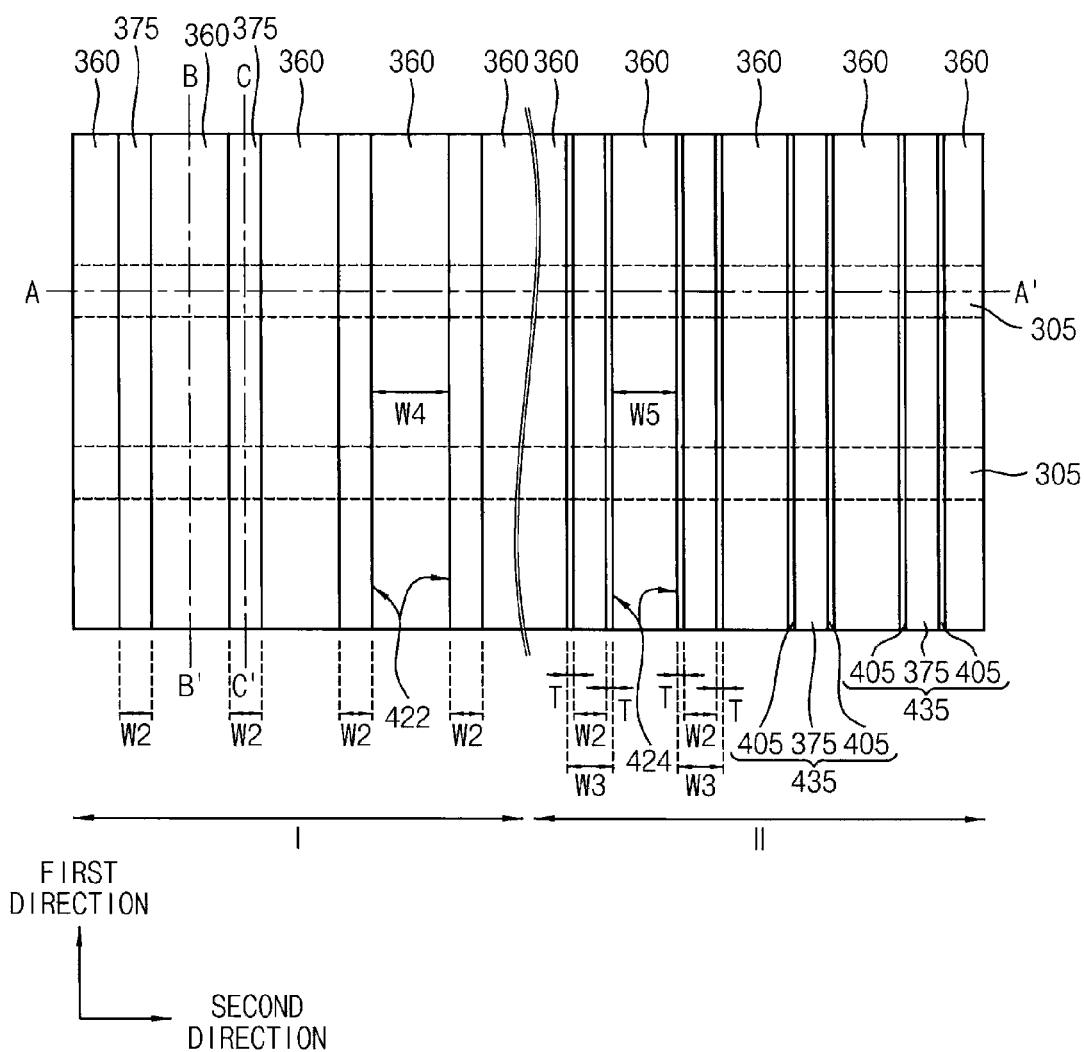
Figure 27:
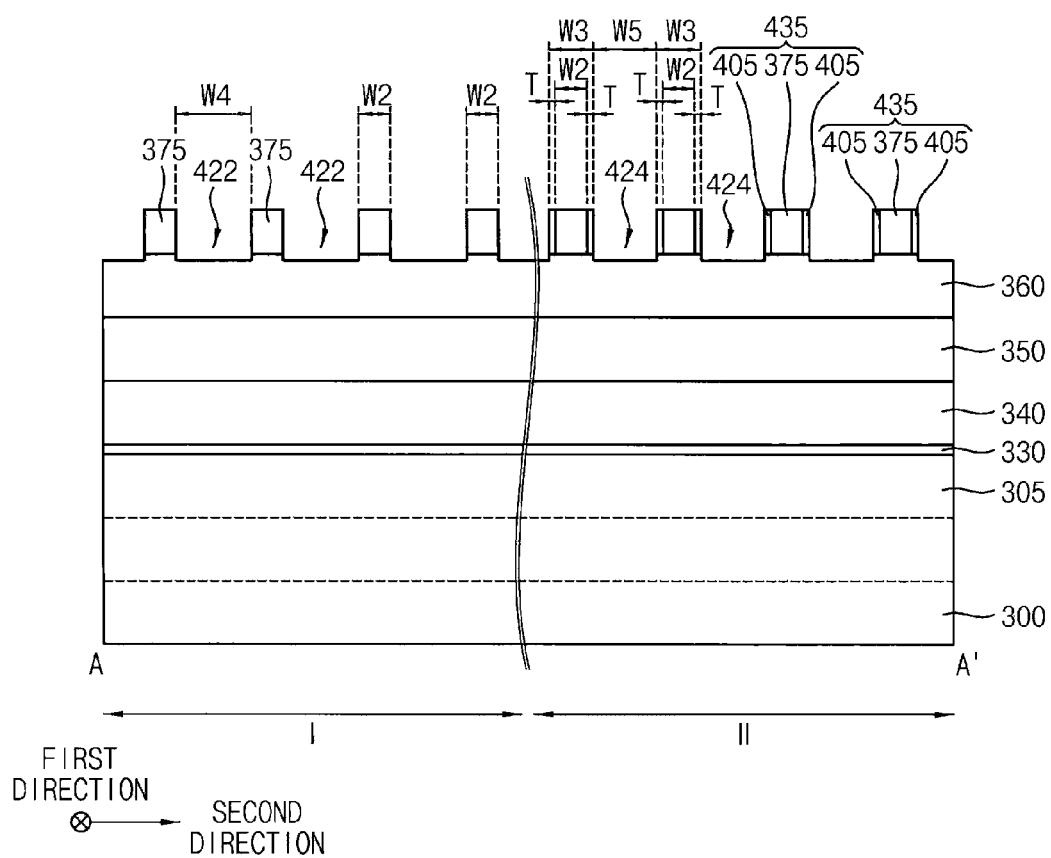

Referring to FIGS. 26 and 27, a process substantially the same as or similar to that illustrated with reference to FIG. 6 may be performed. Thus, after removing the first photoresist pattern 410, a portion of the second mask layer 400 remaining in the second region II may be partially removed to form second masks 405 on both sidewalls of each of the first masks 375 in the second direction.

A third mask 435 including each first mask 375 and the second masks 405 on both sidewalls of each first mask 375 may be formed in the second region II. In some example embodiments, each of the third masks 435 may be formed to extend in the first direction, and the third mask 435 may be disposed in the second direction. Each of the third masks 435 may have a third width W3 greater than the second width W2 of each of the first masks 375.

When the third masks 435 are formed, a first recess 422 having a fourth width W4 in the second direction may be formed on a portion of the intermediate layer 360 between the first masks 375 in the first region I, and a second recess 424 having a fifth width W5 less than the fourth width W4 in the second direction may be formed on a portion of the intermediate layer 360 between the third masks 435 in the second region II.

Figure 28:
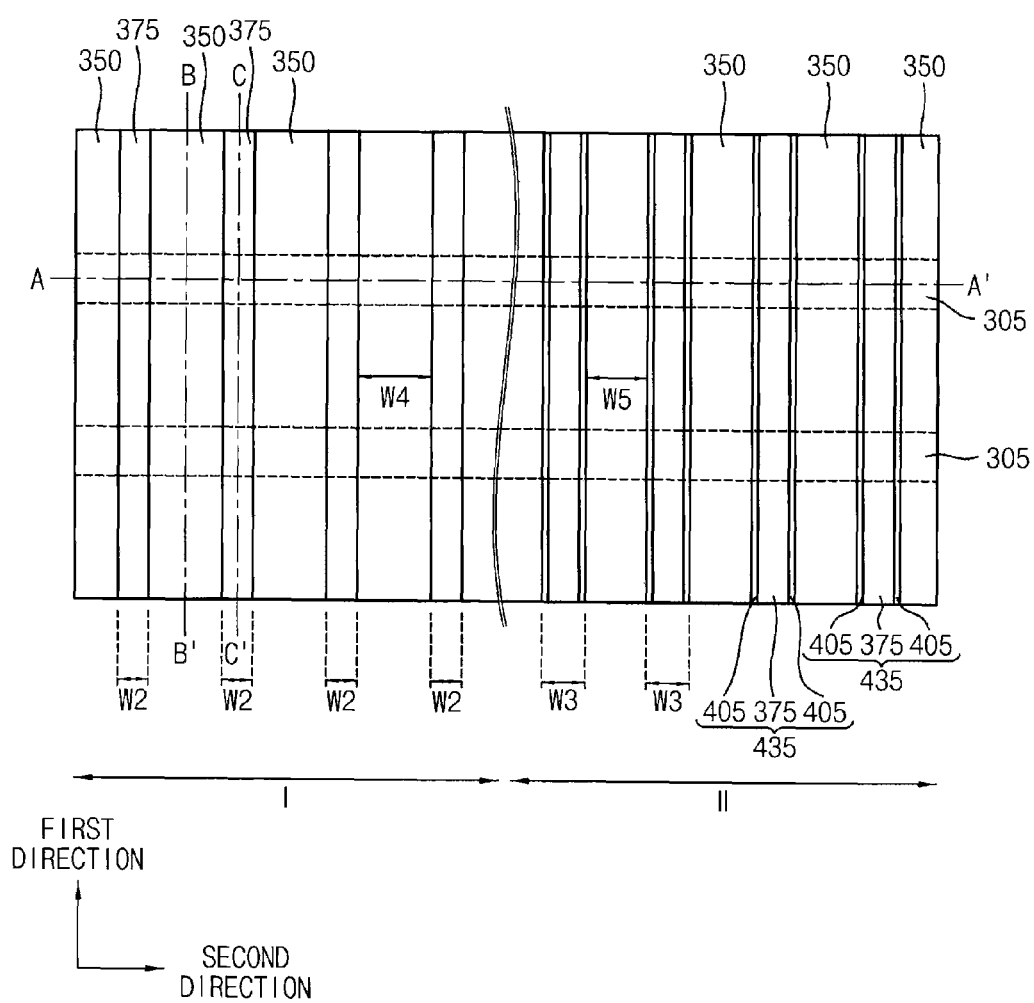
Figure 29:
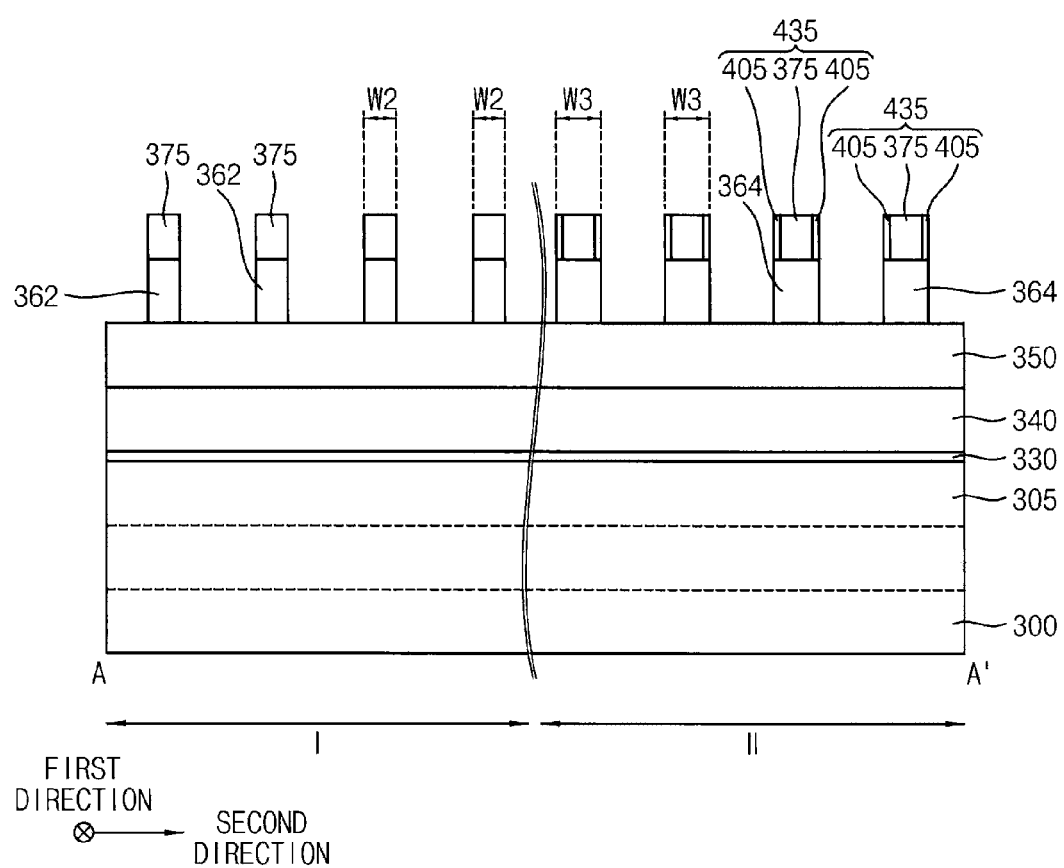

Referring to FIGS. 28 and 29, a process substantially the same as or similar to that illustrated with reference to FIG. 7 may be performed. Thus, the intermediate layer 360 may be etched using the first and third masks 375 and 435 as an etching mask to form first and second patterns 362 and 364 in the first and second regions I and II, respectively.

Each of the first and second patterns 362 and 364 may be formed to extend in the first direction, and the first and second patterns 362 and 364 may have the second and third widths W2 and W3, respectively, in the second direction.

Figure 30:
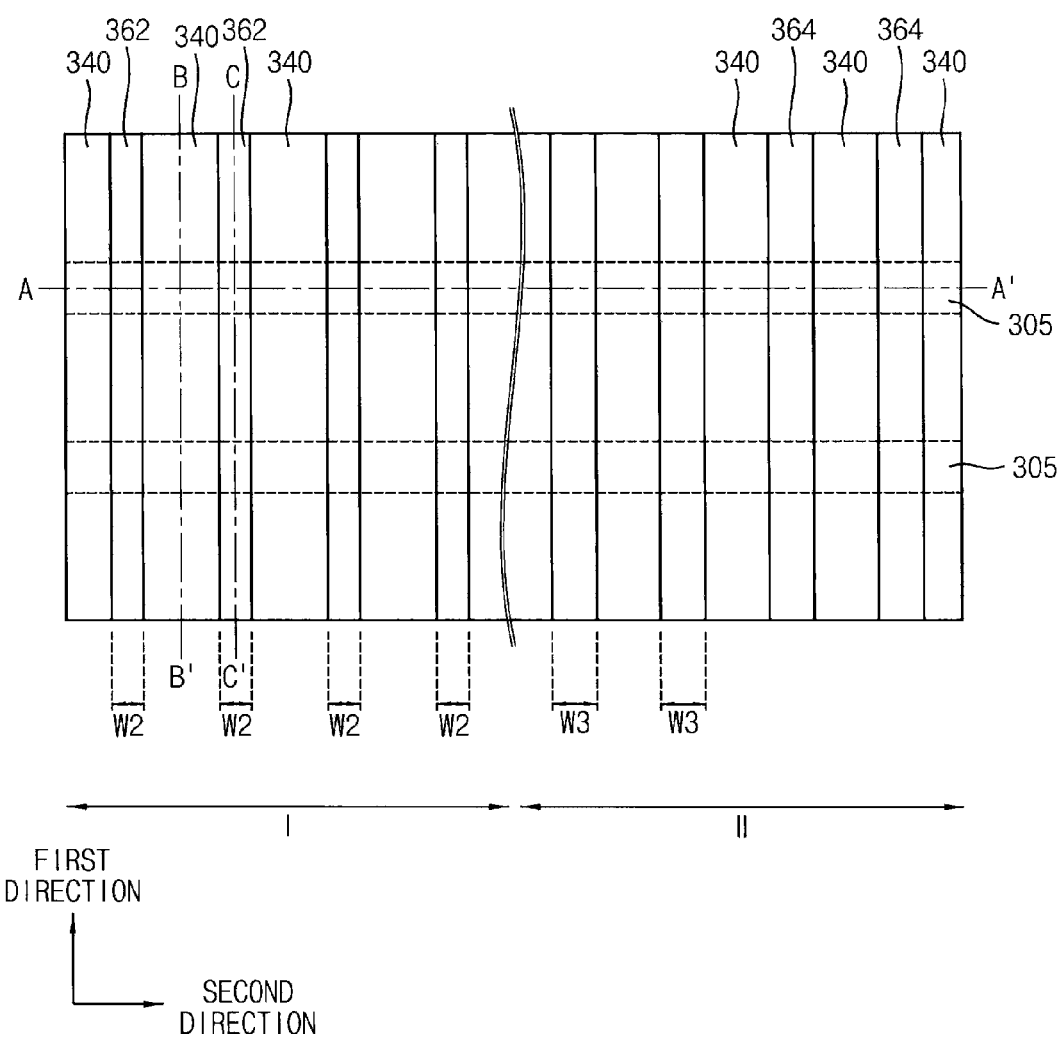
Figure 31:
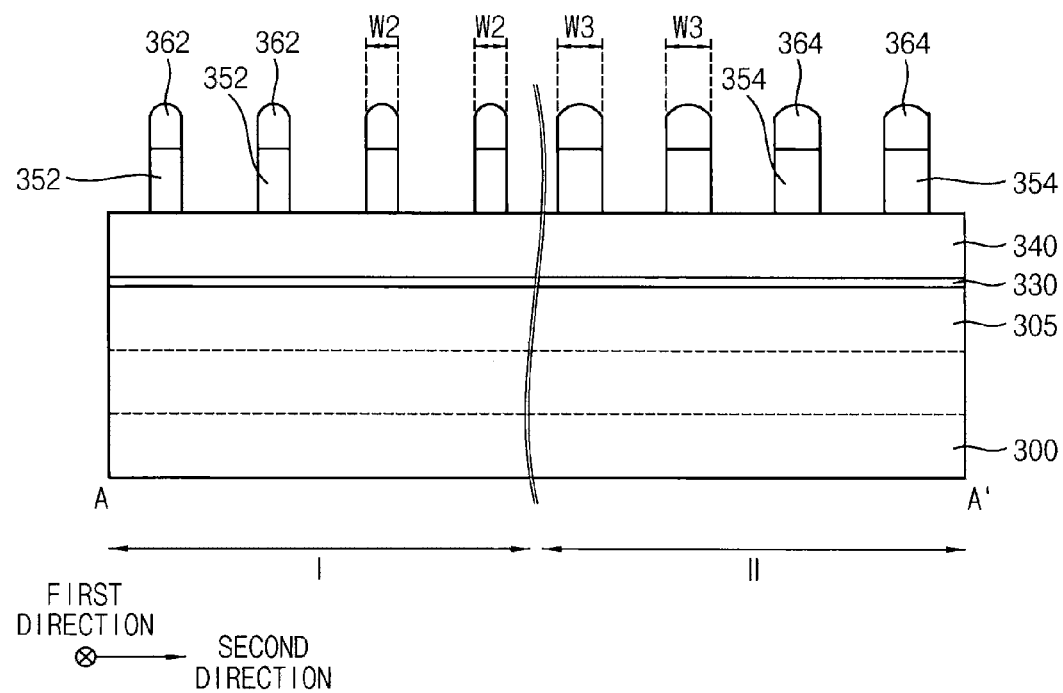

Referring to FIGS. 30 and 31, a process substantially the same as or similar to that illustrated with reference to FIG. 8 may be performed. Thus, a portion of the hard mask layer 350 between first pattern structures each including the first pattern 362 and the first mask 375 sequentially stacked and a portion of the hard mask layer 350 between second pattern structures each including the second pattern 364 and the third mask 435 sequentially stacked may be etched to form first and second hard masks 352 and 354 in the first and second regions I and II, respectively.

Each of the first and second hard masks 352 and 354 may be formed to extend in the first direction in the first and second regions I and II, respectively, and the first and second hard masks 352 and 354 may be formed to have the second and third widths W2 and W3, respectively, in the second direction. When the first and second hard masks 352 and 354 are formed, upper portions of the first and second patterns 362 and 364 may be partially removed.

Figure 32:
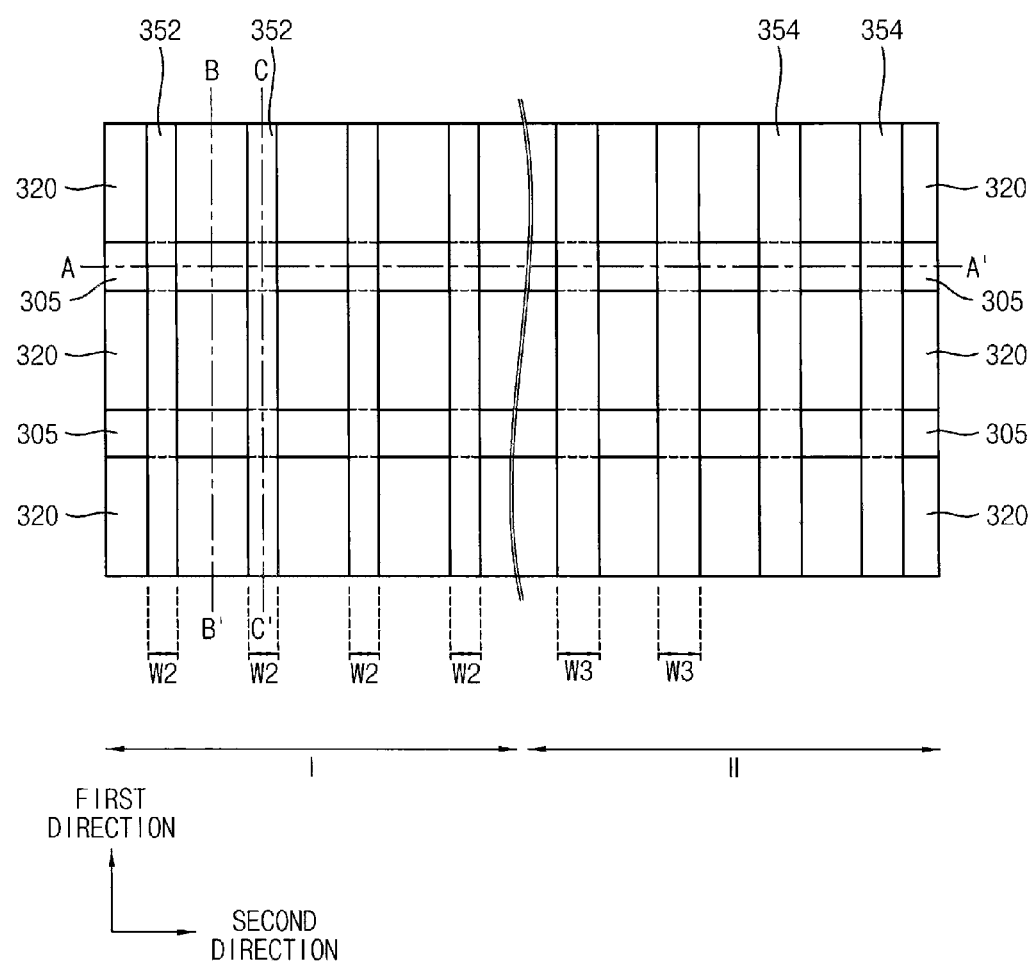
Figure 33:
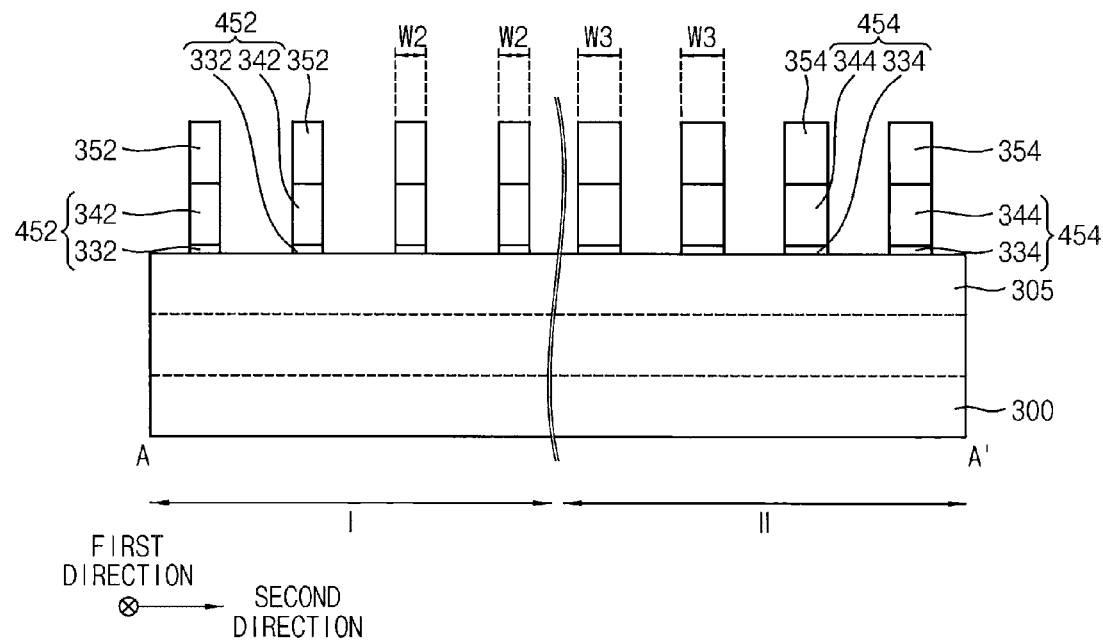
Figure 34:
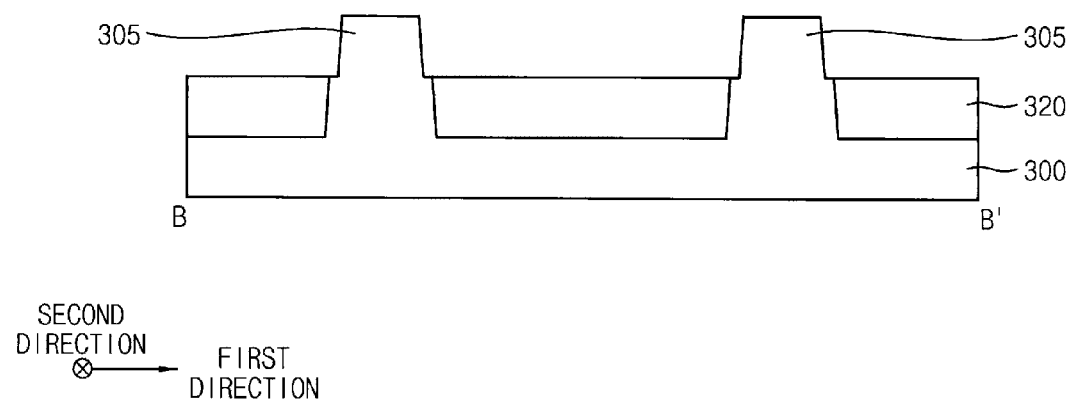
Figure 35:
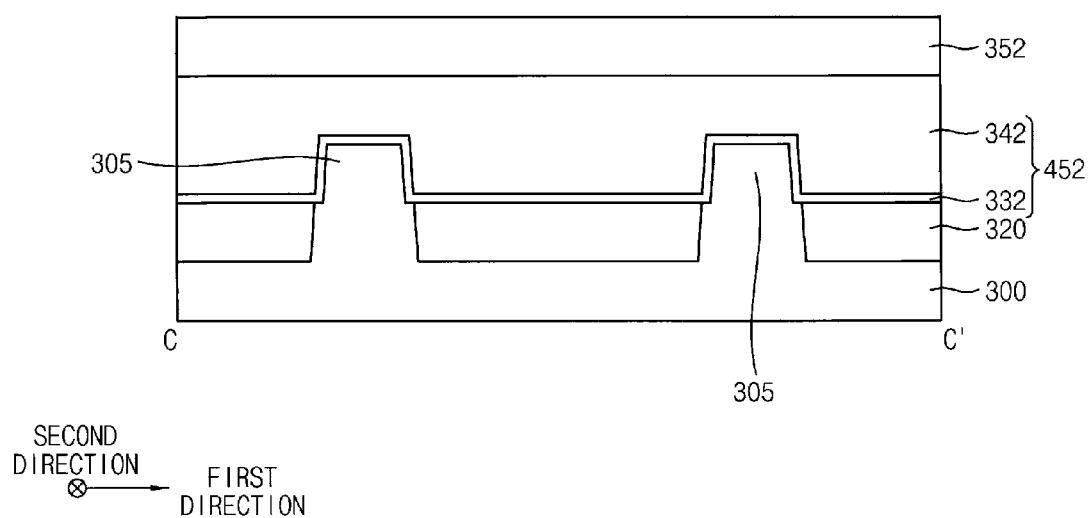

Referring to FIGS. 32 and 33, a process substantially the same as or similar to that illustrated with reference to FIG. 9 may be performed. Thus, the dummy gate layer structure may be etched using the first and second hard masks 352 and 354 as an etching mask to form first and second dummy gate structures 452 and 454 in the first and second regions I and II, respectively.

Each of the first and second dummy gate structures 452 and 454 may be formed to extend in the first direction, and the first and second dummy gate structures 452 and 454 may be formed to have the second and third widths W2 and W3, respectively, in the second direction. The first dummy gate structure 452 may be formed to include a first dummy gate insulation layer pattern 332 and a first dummy gate electrode 342 sequentially stacked on the active fin 305 of the substrate 300 and a portion of the isolation layer pattern 320 adjacent thereto in the first direction, and the second dummy gate structure 454 may be formed to include a second dummy gate insulation layer pattern 334 and a second dummy gate electrode 344 sequentially stacked on the active fin 305 of the substrate 300 and a portion of the isolation layer pattern 320 adjacent thereto in the first direction.

Hereinafter, the first dummy gate structure 452 and the first hard mask 352 sequentially stacked in the first region I may be referred to as a first structure, and the second dummy gate structure 454 and the second hard mask 354 sequentially stacked in the second region II may be referred to as a second structure.

An ion implantation process may be performed to form impurity regions at upper portions of the active fins 305 adjacent to the first and second dummy gate structures 452 and 454, respectively.

Figure 36:
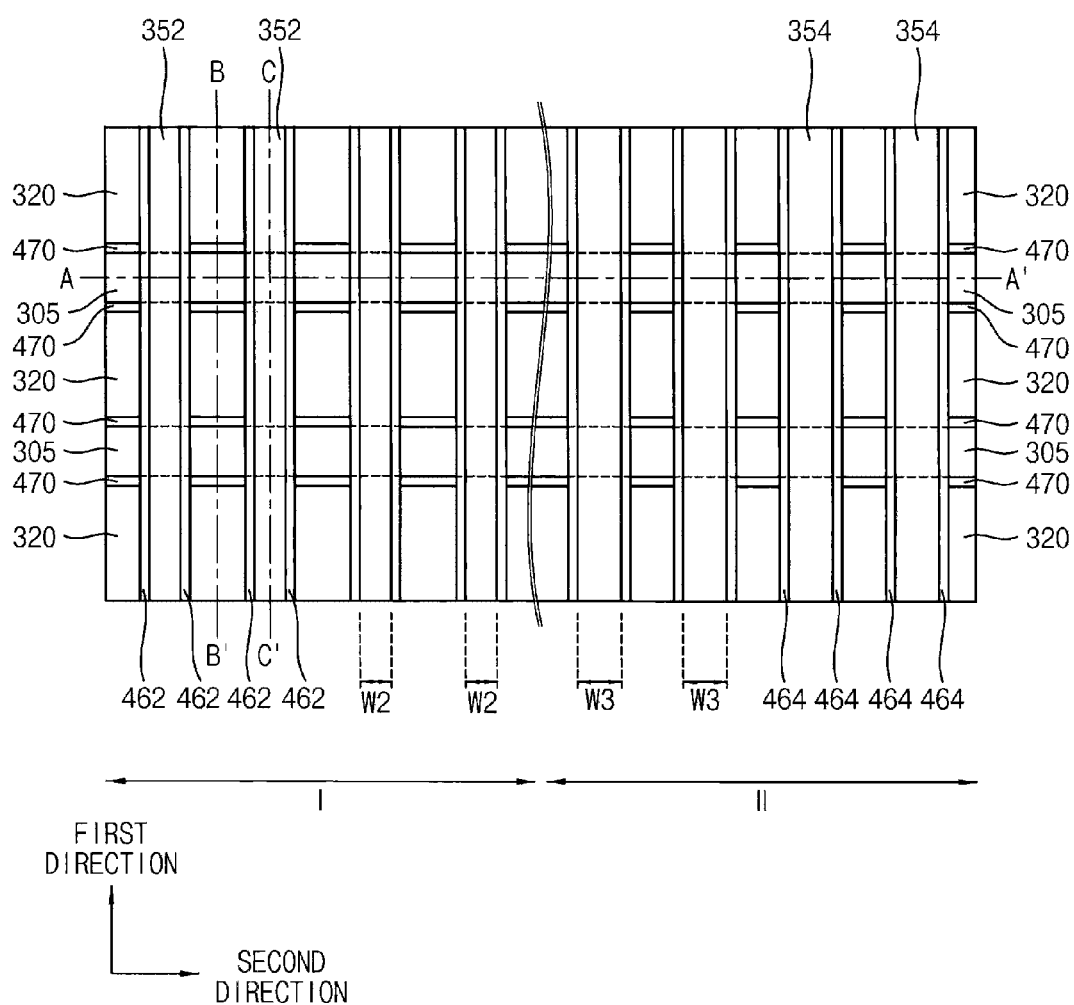
Figure 38:
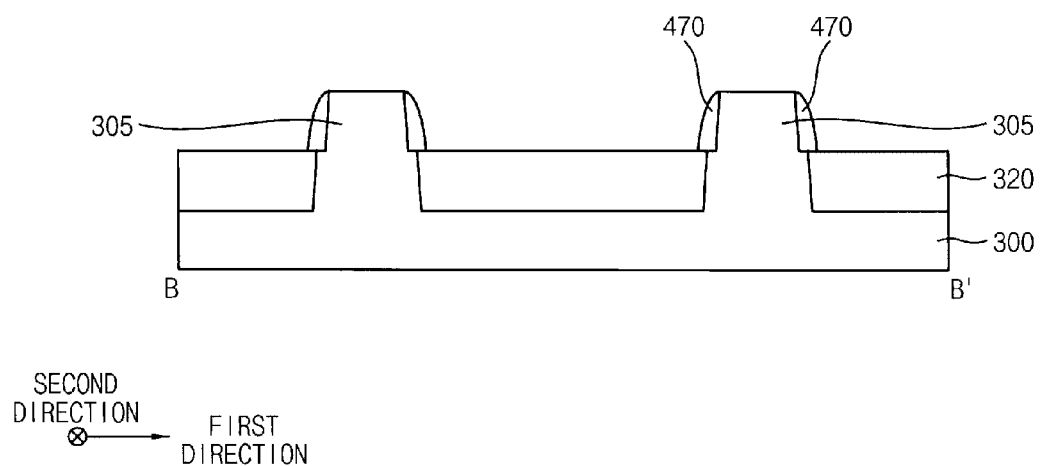

Referring to FIGS. 36 and 38, first and second gate spacers 462 and 464 may be formed on both sidewalls of the first and second structures, respectively, and fin spacers 470 may be formed on both sidewalls of the active fin 305.

In some example embodiment, the first and second gate spacers 462 and 464 and the fin spacers 470 may be formed by forming a spacer layer on the first and second structures, the active fin 305 and the isolation layer pattern 320, and anisotropically etching the spacer layer. The spacer layer may include a nitride, e.g., silicon nitride, silicon carbonitride, etc.

Each of the first and second gate spacers 462 and 464 may be formed on both sidewalls of respective ones of the first and second structures in the second direction, and the fin spacers 470 may be formed on both sidewalls of each of the active fins 305 in the first direction.

Figure 39:
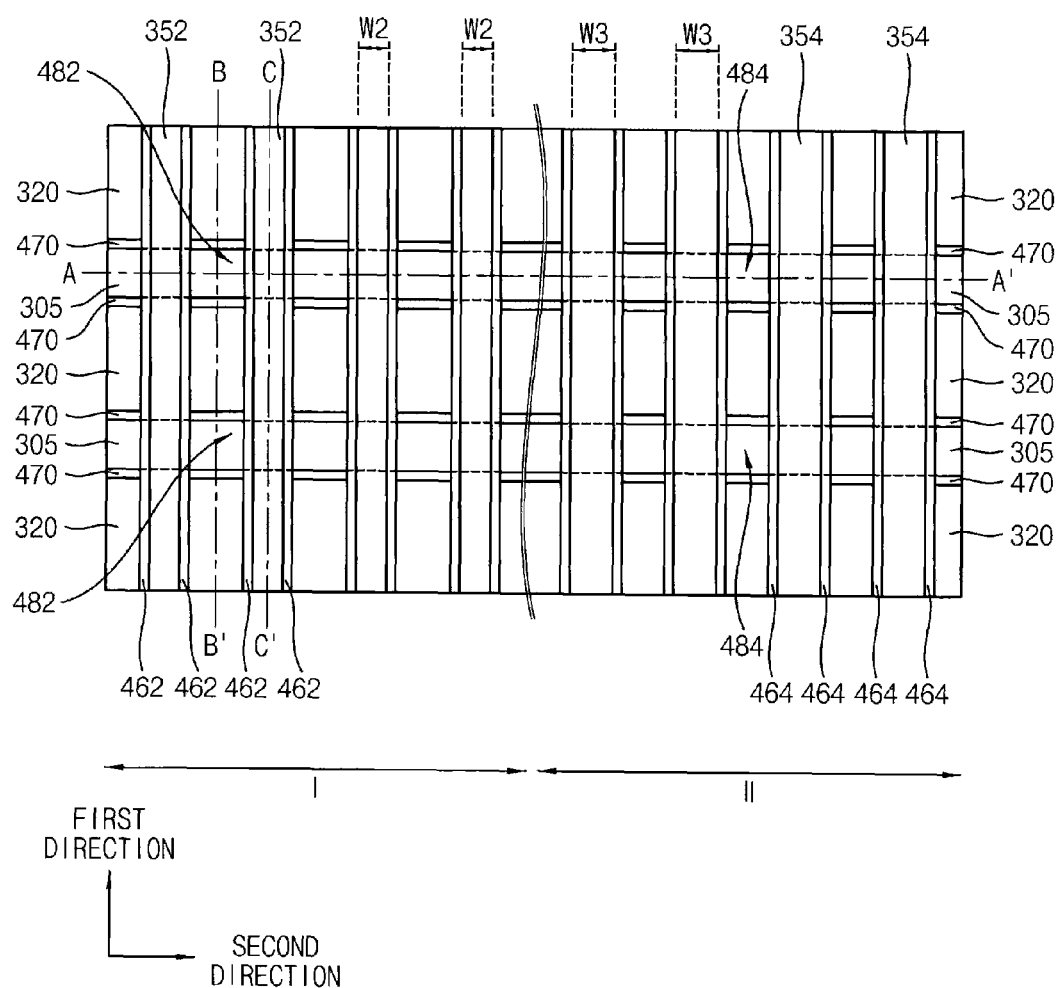
Figure 40:
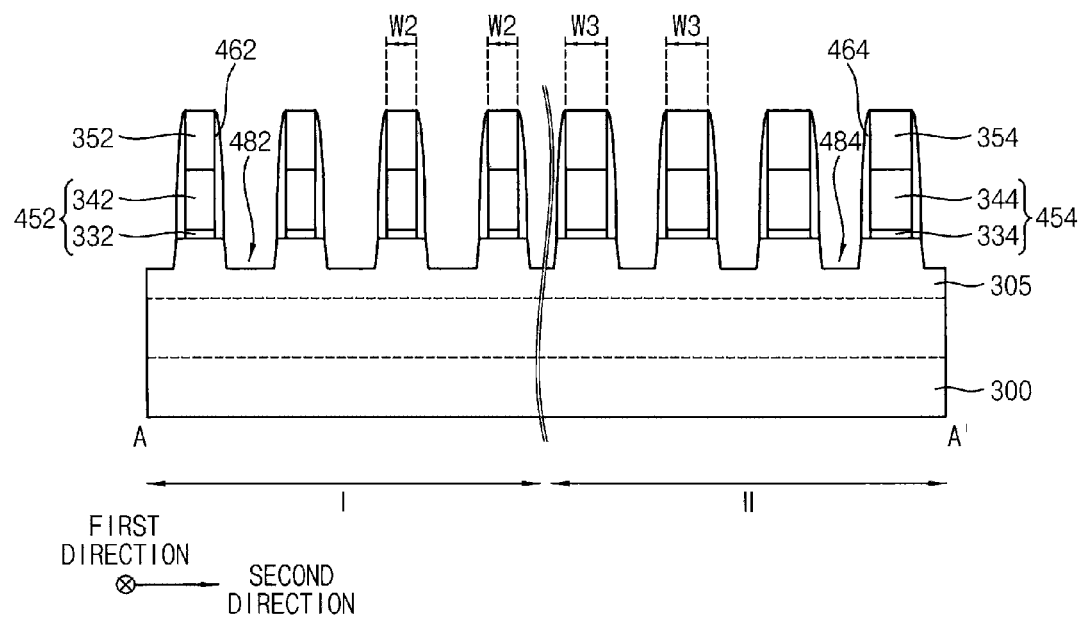
Figure 41:
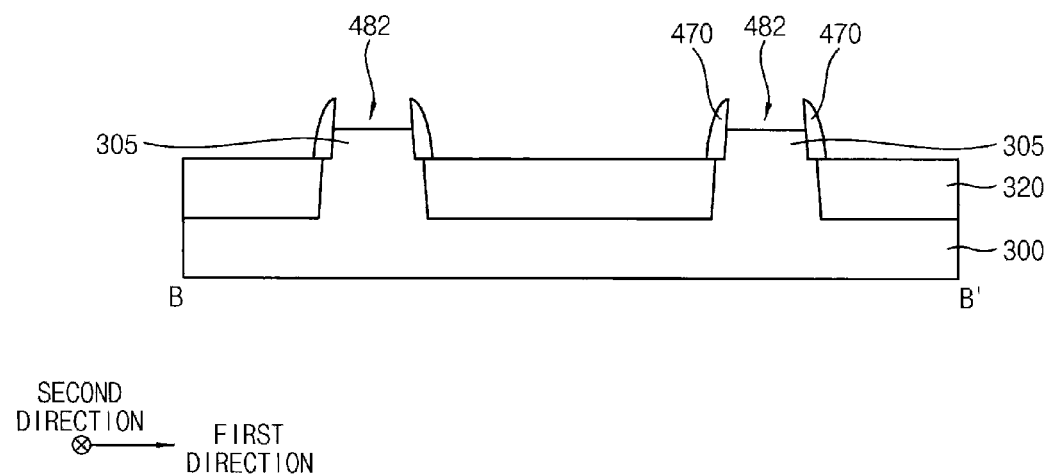

Referring to FIGS. 39 to 41, an upper portion of the active fin 305 may be etched using the first and second structures, and the first and second gate spacers 462 and 464 as an etching mask to form second and third trenches 482 and 484 in the first and second regions I and II, respectively.

Each of the second and third trenches 482 and 484 may be formed to have a given depth toward an inside of the substrate 300 and a given width in the second direction.

FIGS. 39 to 41 show that the second and third trenches 482 and 484 are formed in the upper portion of the active fin 305 of which a sidewall may not be covered by the isolation layer pattern 320, however, the present inventive concepts may not be limited thereto, and the second and third trenches 482 and 484 may be also formed in the lower portion of the active fin 305 of which a sidewall may be covered by the isolation layer pattern 320. Additionally, FIGS. 39 to 41 show that each of the second and third trenches 482 and 484 has a cross-section taken along the second direction of which a shape may be a rectangle, however, the present inventive concepts may not be limited thereto, and the cross-section may have other shape, e.g., a U-like shape, a partial circular shape, a sigma shape, etc.

Figure 37:
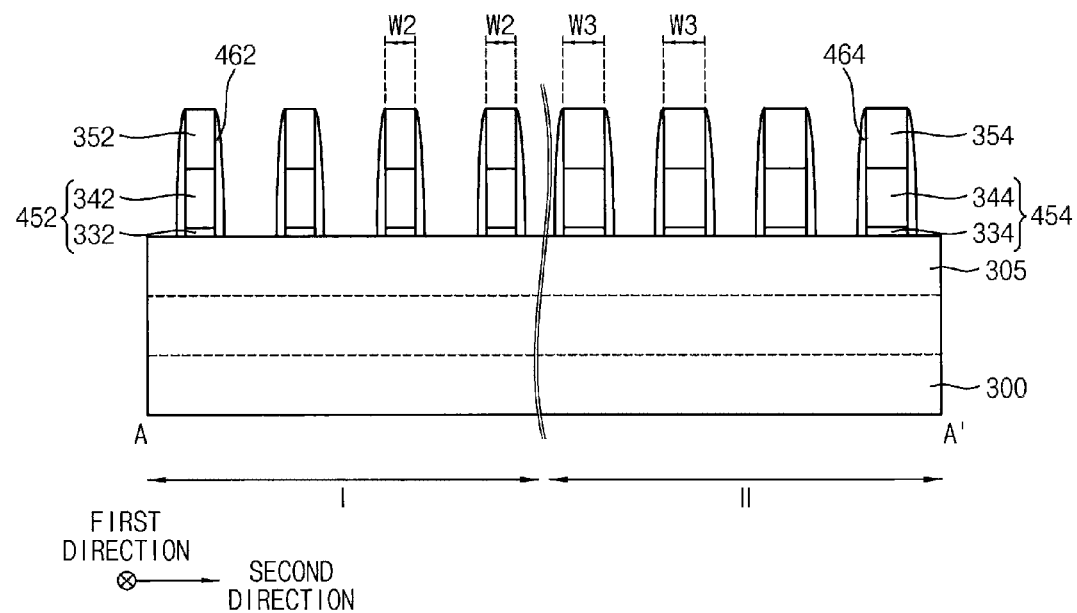

In some example embodiments, the process for forming the second and third trenches 482 and 484 and the etching process for the spacer layer described with reference to FIGS. 36 to 38 may be performed in-situ.

Figure 42:
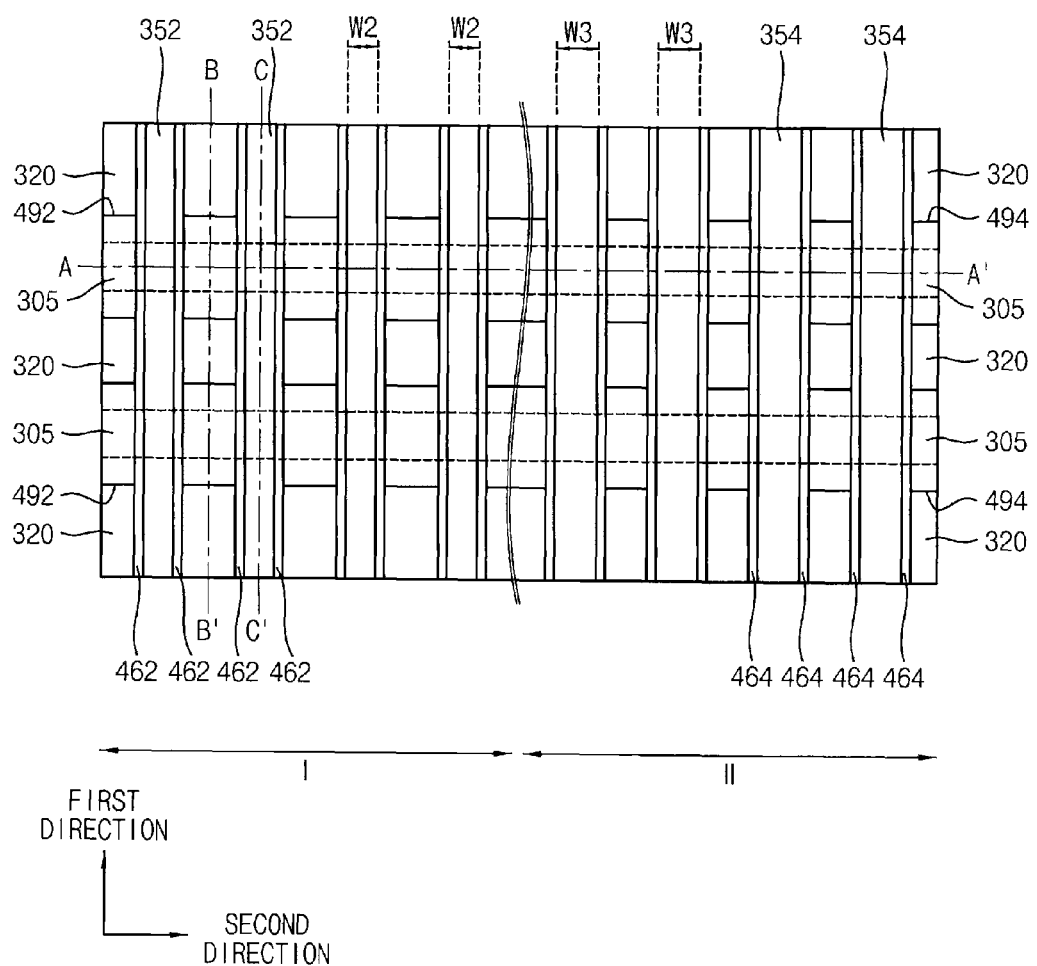
Figure 43:
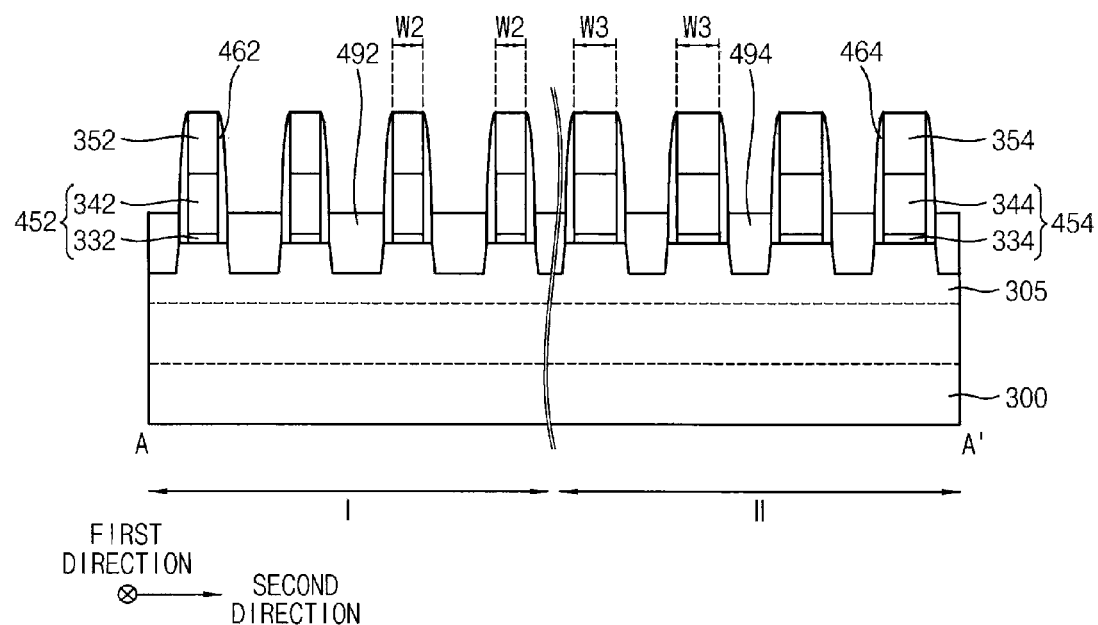
Figure 44:
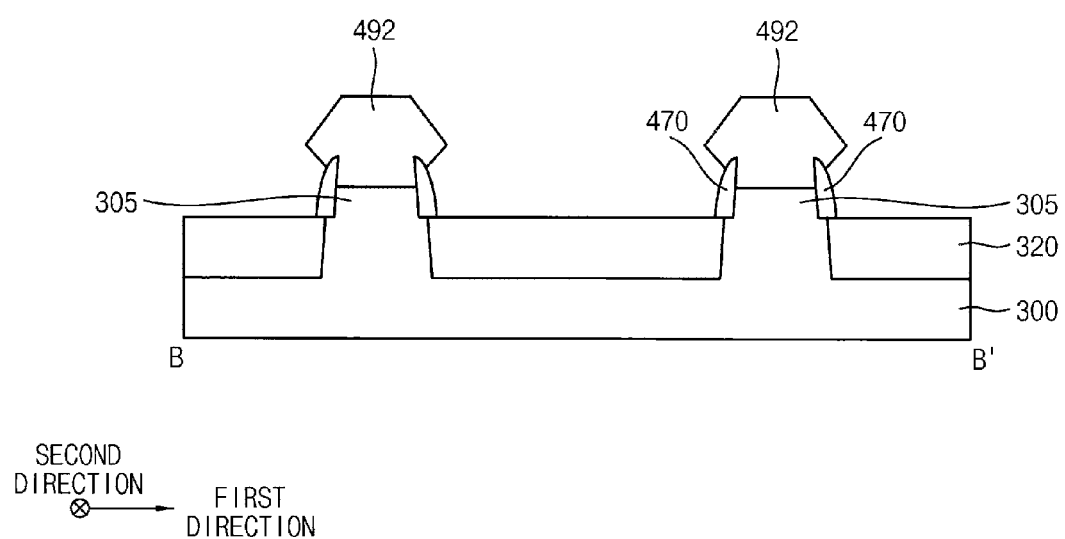

Referring to FIGS. 42 to 44, first and second source/drain layers 492 and 494 may be formed on the active fin 305 to fill the second and third trenches 482 and 484, respectively.

In at least one example embodiment, the first and second source/drain layers 492 and 494 may be formed by a selective epitaxial growth (SEG) process using top surfaces of the active fins 305 exposed by the second and third trenches 482 and 484 as a seed.

In some example embodiments, the SEG process may be performed using a silicon source gas, e.g., dichlorosilane ($SiH_2Cl_2$) gas, and a germanium source gas, e.g., germane ($GeH_4$) gas to form a single crystalline silicon-germanium layer. A p-type impurity source gas, e.g., diborane ($B_2H_6$) gas may be also used to form a single crystalline silicon-germanium layer doped with p-type impurities. Accordingly, each of the first and second source/drain layers 492 and 494 may serve as a source/drain region of a p-channel metal oxide semiconductor (PMOS) transistor.

In other example embodiments, each of the first and second source/drain layers 492 and 494 may grow both in vertical and horizontal directions so that an upper portion thereof may have a cross-section taken along the first direction of which a shape may be pentagon or hexagon. Each of the first and second source/drain layers 492 and 494 may be formed to have a top surface higher than a top surface of the active fin 305, and thus may form an elevated source/drain (ESD) layer.

In other example embodiments, the SEG process may be performed using a silicon source gas, e.g., disilane ($Si_2H_6$) gas and a carbon source gas, e.g., monomethylsilane ($SiH_3CH_3$) gas to form a single crystalline silicon carbide layer. In an alternative example embodiment, the SEG process may be performed using only a silicon source gas, e.g., disilane ($Si_2H_6$) gas to form a single crystalline silicon layer. An n-type impurity source gas, e.g., phosphine ($PH_3$) gas may be also used to form a single crystalline silicon carbide layer doped with n-type impurities or a single crystalline silicon layer doped with n-type impurities. Accordingly, each of the first and second source/drain layers 492 and 494 may serve as a source/drain region of an n-channel metal oxide semiconductor (NMOS) transistor.

In some example embodiments, one of the first and second source/drain layers 492 and 494 may serve as a source/drain region of a PMOS transistor, and the other of the first and second source/drain layers 492 and 494 may serve as a source/drain region of an NMOS transistor.

Figure 46:
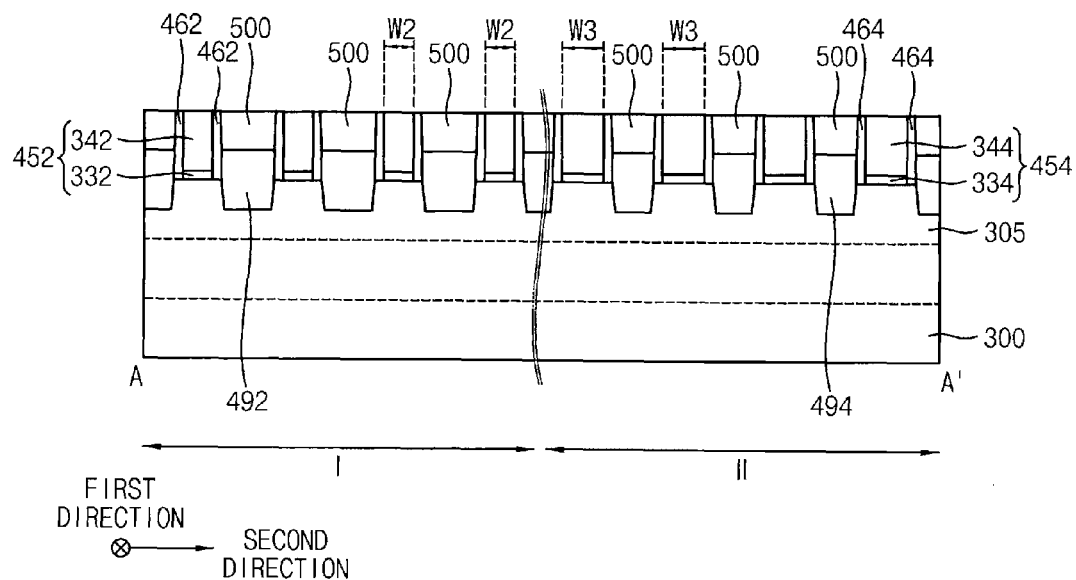
Figure 47:
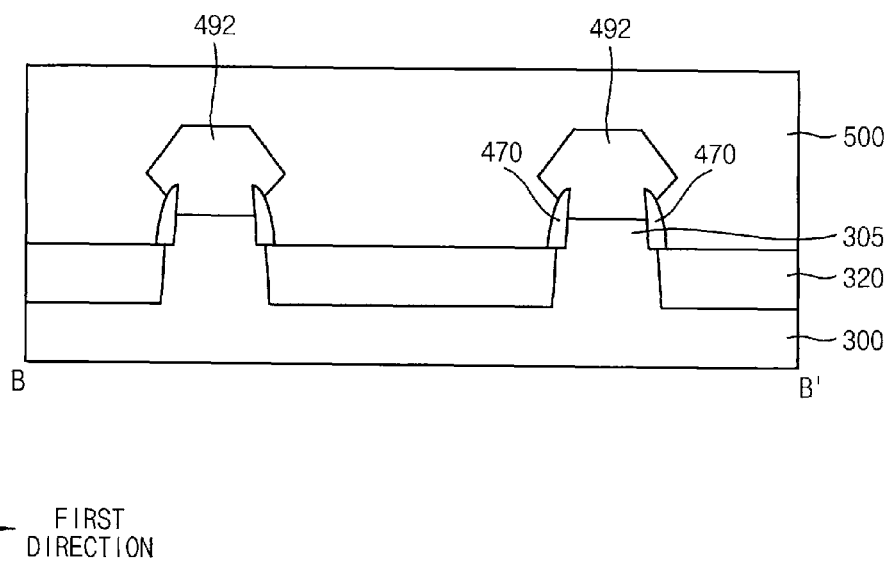

Referring to FIGS. 45 to 47, a first insulating interlayer 500 may be formed on the first and second structures, the first and second gate spacers 462 and 464, the first and second source/drain layers 492 and 494, and the isolation layer pattern 320 to have a top surface higher than those of the first and second structures, and may be planarized until top surfaces of the first and second dummy gate electrodes 342 and 344 of the first and second dummy gate structures 452 and 454, respectively, may be exposed. The first insulating interlayer 500 may include an oxide, e.g., silicon oxide. In the planarization process, the first and second hard masks 352 and 354 on the first and second dummy gate electrodes 342 and 344, respectively, and upper portions of the first and second gate spacers 462 and 464 may be also removed. The planarization process may be performed by a chemical mechanical polishing (CMP) process and/or an etch back process.

Figure 49:
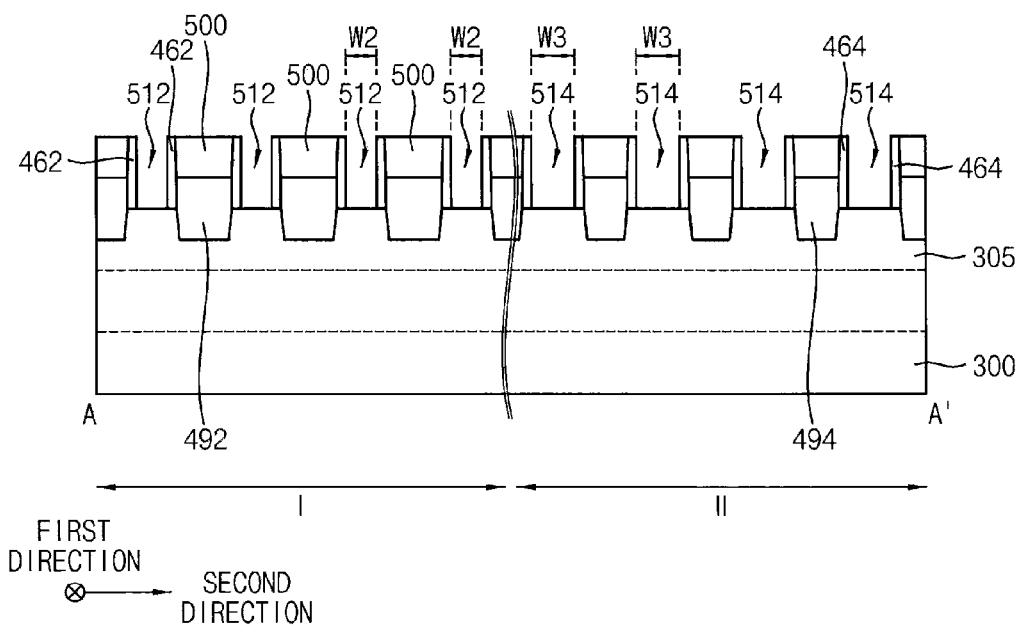
Figure 50:
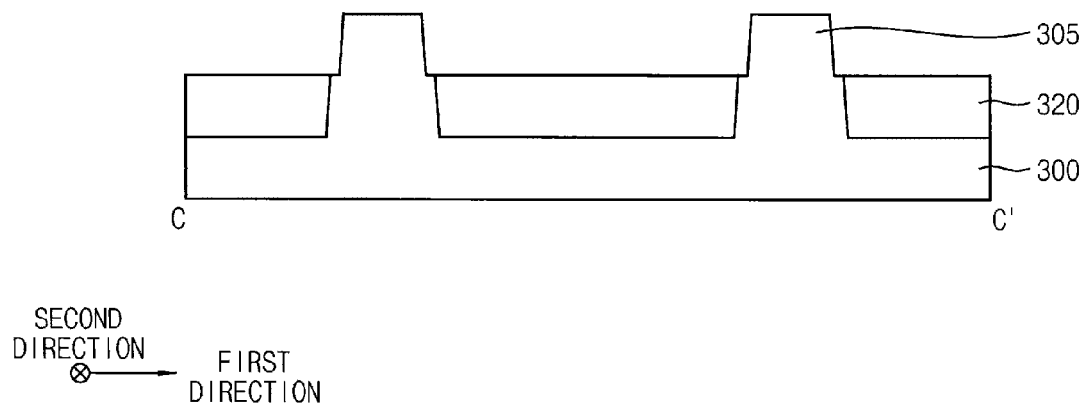

Referring to FIGS. 48 to 50, the exposed first and second dummy gate electrodes 342 and 344, and the first and second dummy gate insulation layer patterns 332 and 334 thereunder may be removed to form first and second openings 512 and 514, respectively, exposing top surfaces of the active fins 305 of the substrate 300 and a top surface of the isolation layer pattern 320 adjacent thereto.

The exposed first and second dummy gate electrodes 342 and 344 may be removed by a dry etch process first, and then a wet etch process. In some example embodiments, the wet etch process may be performed using ammonia hydroxide (NH$_4$OH) as an etching solution.

Each of the first and second openings 512 and 514 may be formed to extend in the first direction, and the first and second openings 512 and 514 may be formed to have the second and third widths W2 and W3, respectively, in the second direction.

Figure 51:
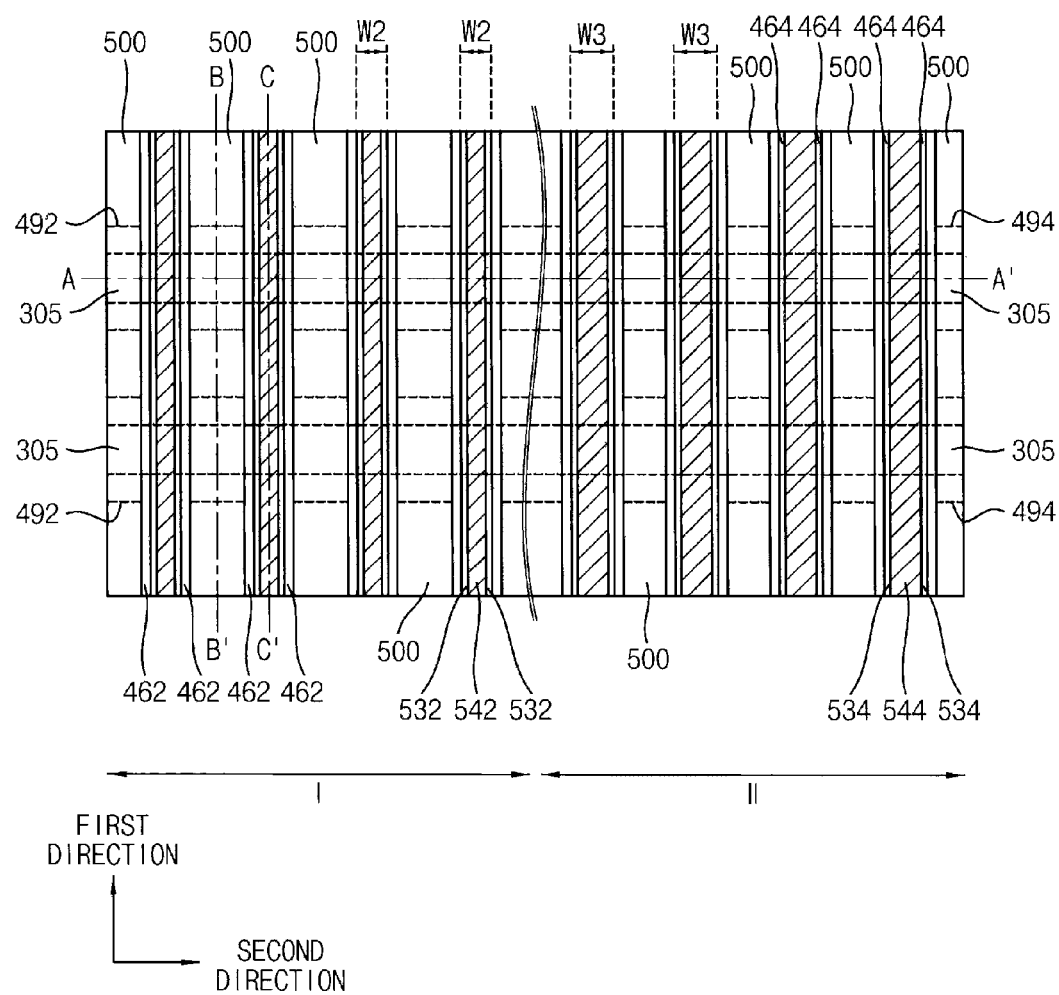
Figure 52:
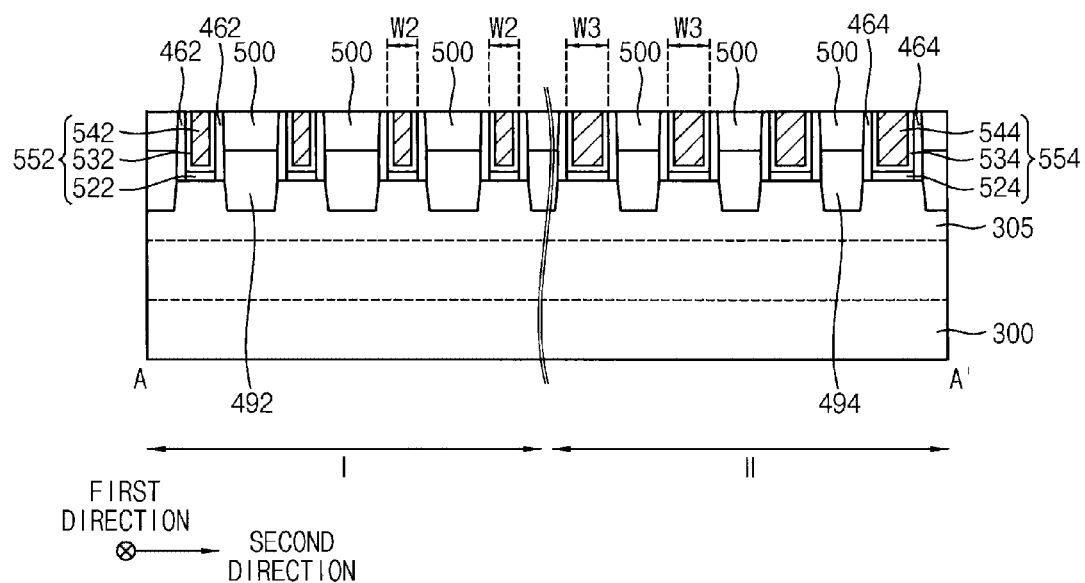
Figure 53:
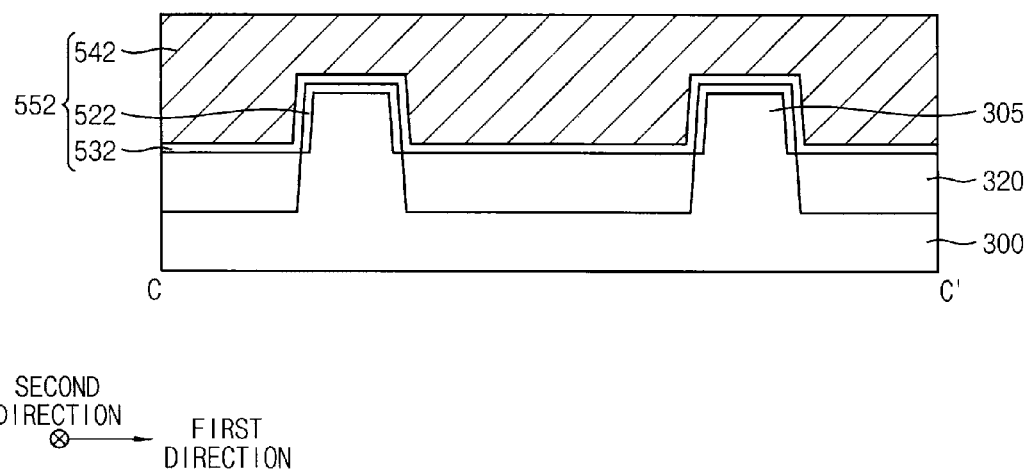
Figure 54:
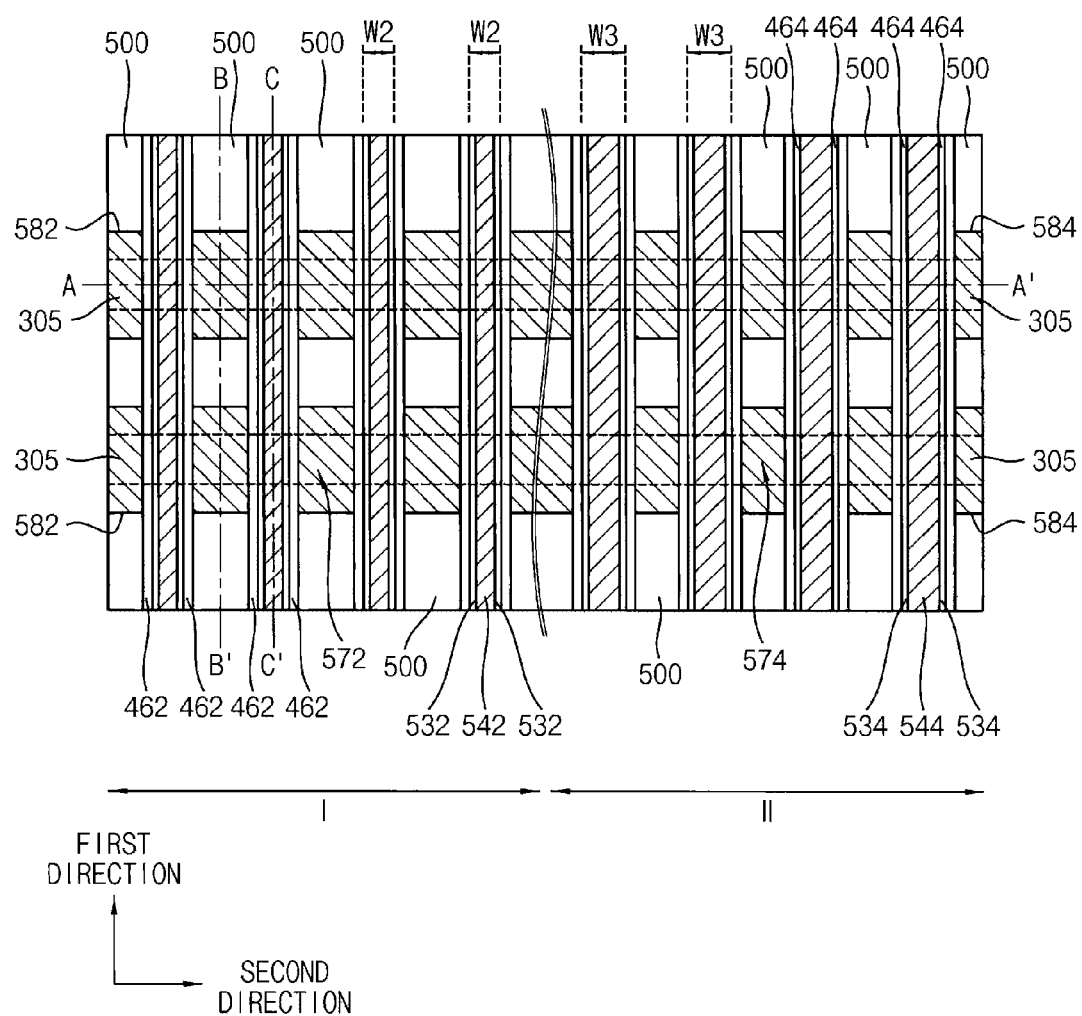
Figure 55:
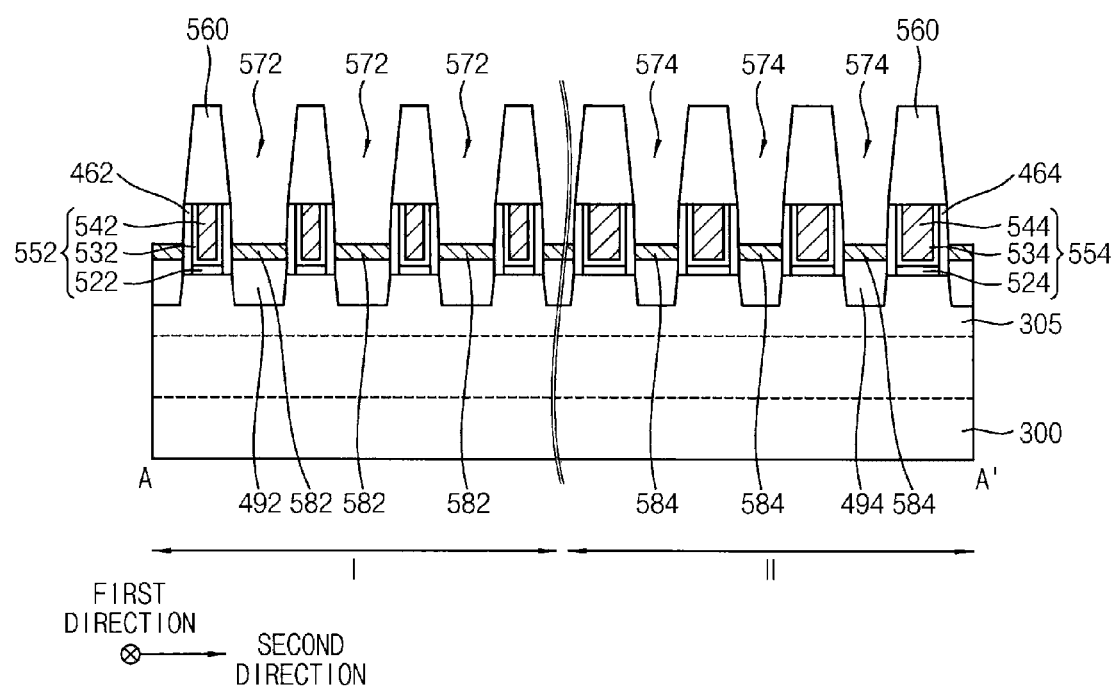
Figure 56:
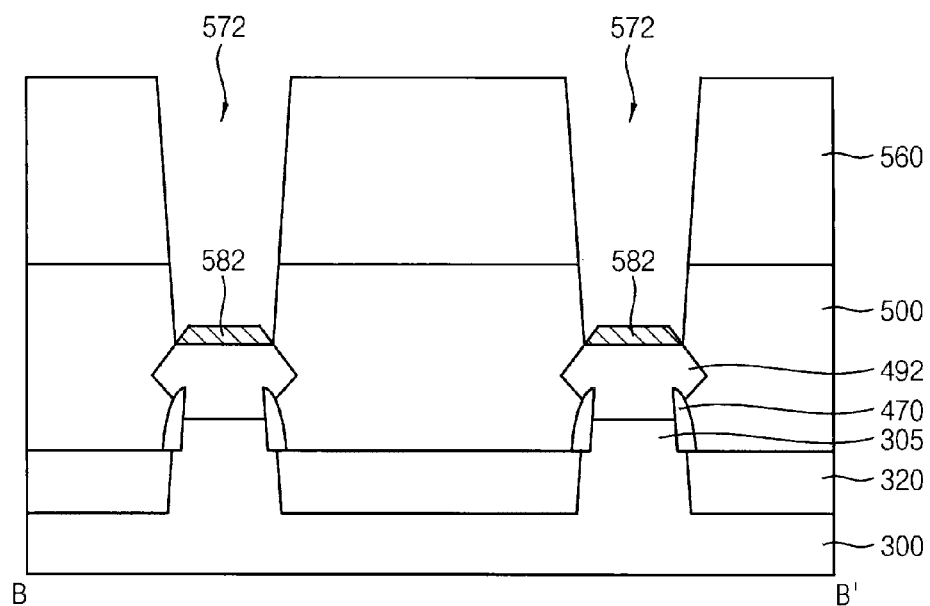
Figure 57:
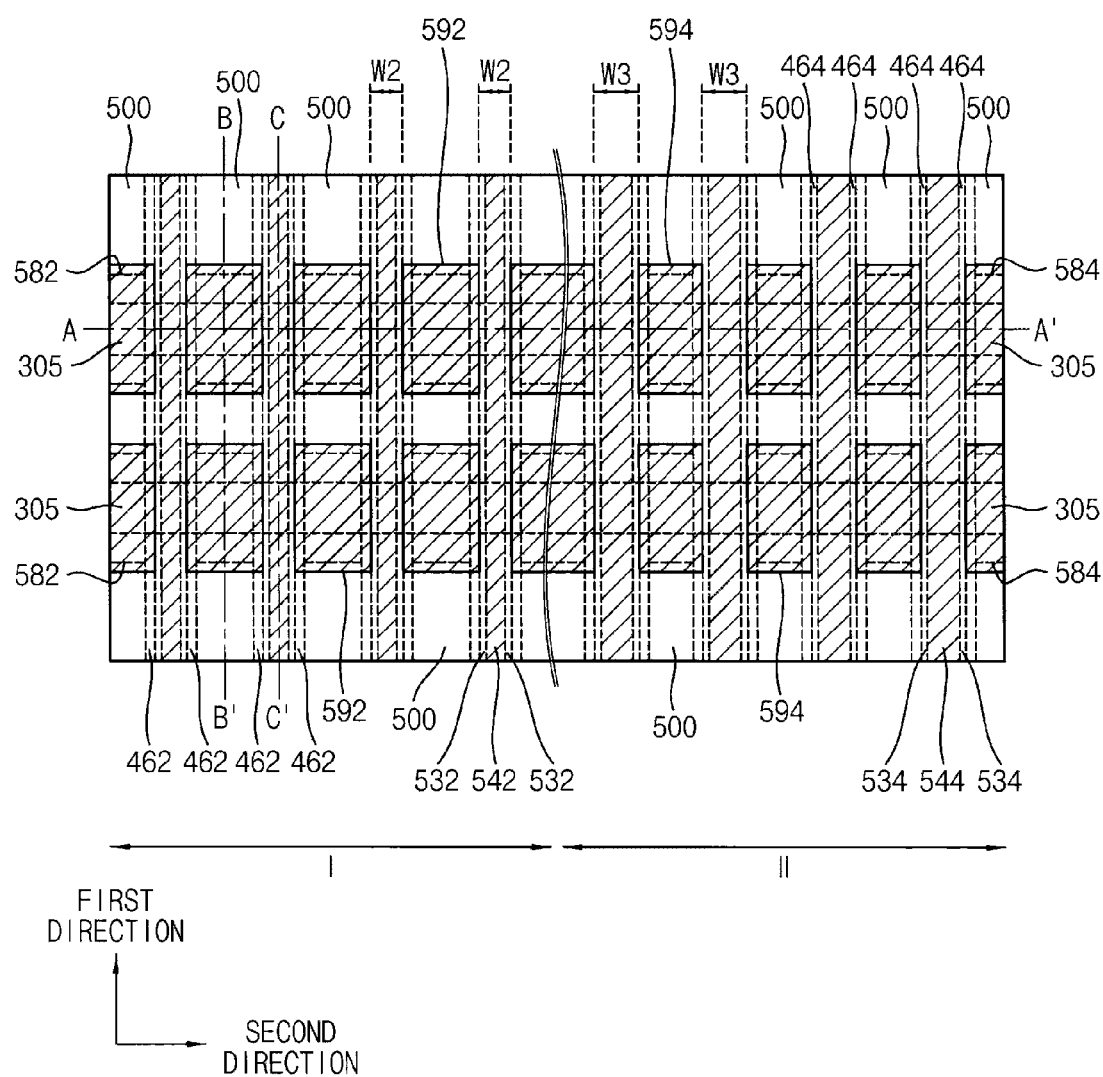
Figure 58:
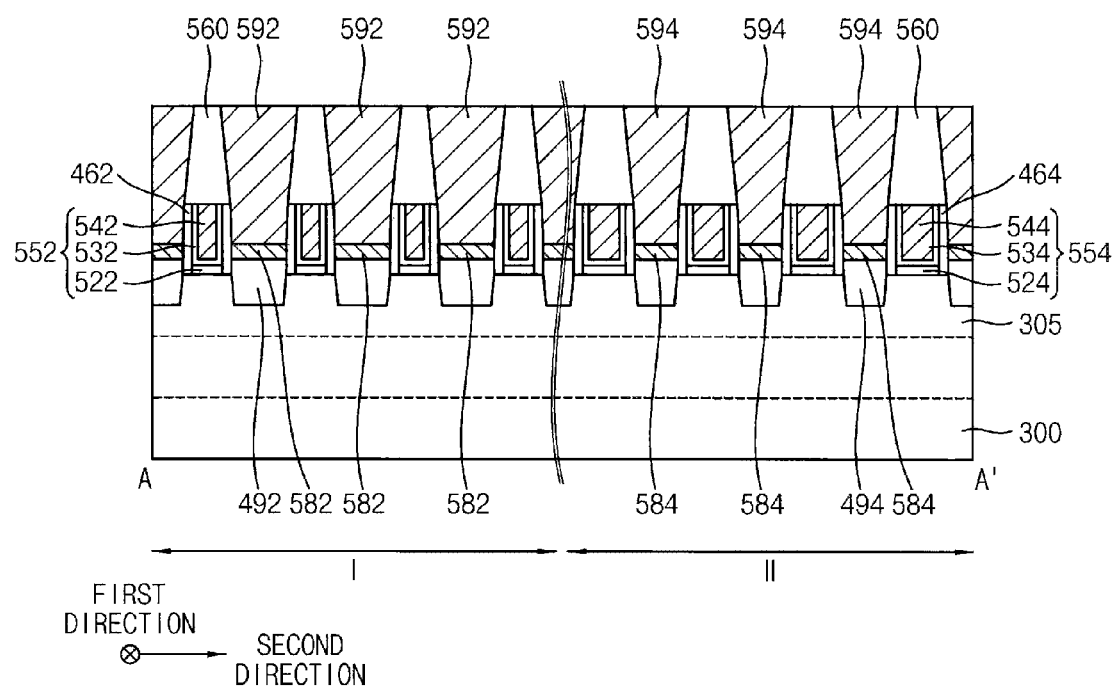
Figure 59:
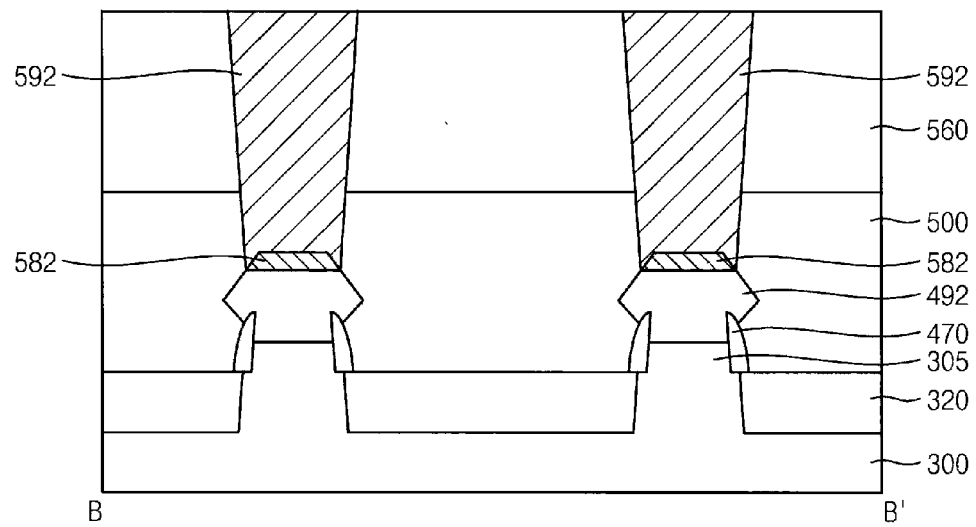
Figure 60:
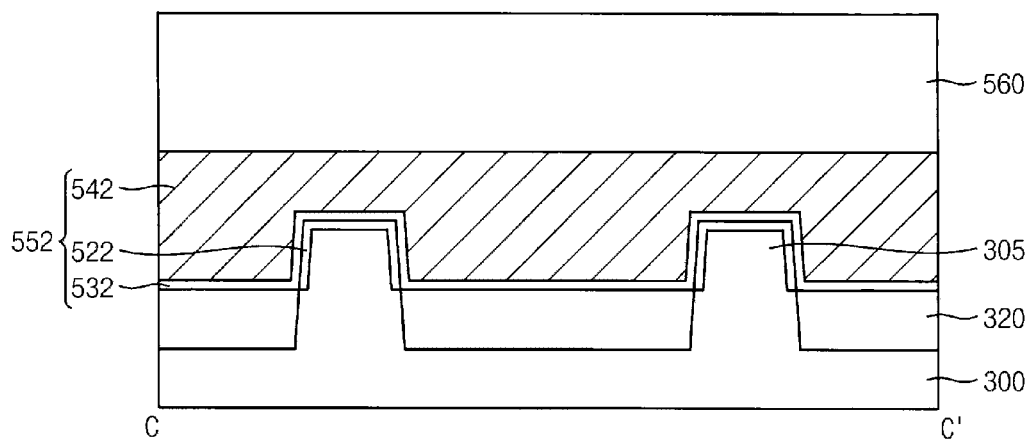

Referring to FIGS. 51 to 53, a first interface layer pattern 522, a first gate insulation layer pattern 532 and a first gate electrode 542 may be sequentially formed to fill the first opening 512, and a second interface layer pattern 524, a second gate insulation layer pattern 534 and a second gate electrode 544 may be sequentially formed to fill the second opening 514.

Particularly, after a thermal oxidation process may be performed on the top surfaces of the active fins 305 of the substrate 300 exposed by the first and second openings 512 and 514 to form the first and second interface layer patterns 522 and 524, a gate insulation layer may be formed on top surfaces of the first and second interface layer patterns 522 and 524, the exposed top surface of the isolation layer pattern 320, inner sidewalls of the first and second gate spacers 462 and 464, and a top surface of the first insulating interlayer 500, and a gate electrode layer may be formed on the gate insulation layer to sufficiently fill remaining portions of the first and second openings 512 and 514.

The first and second interface layer patterns 522 and 524 may include, e.g., silicon oxide, the gate insulation layer may include a metal oxide having a high dielectric constant, e.g., hafnium oxide, tantalum oxide, zirconium oxide, or the like, and the gate electrode layer may include a material having a low resistance, e.g., a metal such as aluminum, copper, tantalum, titanium, etc., and/or a metal nitride thereof.

The gate insulation layer and the gate electrode layer may be formed by a CVD process, a physical vapor deposition (PVD) process, an ALD process, or the like. The first and second interface layer patterns 522 and 524 may be also formed by a CVD process, a PVD process, an ALD process instead of the thermal oxidation process. In this case, the first and second interface layer patterns 522 and 524 may be formed not only on the top surfaces of the active fins 305, but also on the top surface of the isolation layer pattern 320 and the inner sidewalls of the first and second gate spacers 462 and 464.

In some example embodiments, the first and second interface layer patterns 522 and 524 may not be formed. Additionally, a work function control layer may be further formed between the gate insulation layer and the gate electrode layer. The work function control layer may include a metal nitride or an alloy, e.g., titanium nitride, titanium aluminum, titanium aluminum nitride, tantalum nitride, tantalum aluminum nitride, etc.

The gate electrode layer and the gate insulation layer may be planarized until the top surface of the first insulating interlayer 500 may be exposed to form the first and second gate electrodes 542 and 544 and the first and second gate insulation layer patterns 532 and 534. The planarization process may be performed by a CMP process and/or an etch back process.

Thus, the first interface layer pattern 522 may be formed on the top surface of the active fin 305 exposed by the first opening 512 in the first region I, the first gate insulation layer pattern 532 may be formed on the top surface of the first interface layer pattern 522 and the inner sidewall of the first gate spacer 462, and the first gate electrode 542 may be formed on the first gate insulation layer pattern 532 to fill a remaining portion of the first opening 512. Additionally, the second interface layer pattern 524 may be formed on the top surface of the active fin 305 exposed by the second opening 514 in the second region II, the second gate insulation layer pattern 534 may be formed on the top surface of the second interface layer pattern 524 and the inner sidewall of the second gate spacer 464, and the second gate electrode 544 may be formed on the second gate insulation layer pattern 534 to fill a remaining portion of the second opening 514.

The first interface layer pattern 522, the first gate insulation layer pattern 532 and the first gate electrode 542 sequentially stacked may form a first gate structure 552, and the first gate structure 552 and the first source/drain layer 492 may define a PMOS transistor or an NMOS transistor. Additionally, the second interface layer pattern 524, the second gate insulation layer pattern 534 and the second gate electrode 544 sequentially stacked may form a second gate structure 554, and the second gate structure 554 and the second source/drain layer 494 may define a PMOS transistor or an NMOS transistor.

In some example embodiments, each of the first and second gate structures 552 and 554 filling the first and second openings 512 and 514, respectively, may be formed to extend in the first direction, and the first and second gate structures 552 and 554 may be formed to have the second and third widths W2 and W3, respectively. That is, the first gate structure 552 in the first region I may have the minute second width W2, and the second gate structure 554 in the second region II may have the minute third width W3 greater than the second width W2.

In the method of manufacturing the semiconductor device in accordance with example embodiments, the first and second gate structures 552 and 554 having the different widths W2 and W3 in the different regions I and II may be easily formed, and the semiconductor device may have enhanced electrical characteristics.

Referring to FIGS. 54 to 57, a second insulating interlayer 560 may be formed on the first insulating interlayer 500, the first and second gate structures 552 and 554, and the first and second gate spacers 462 and 464. Third and fourth openings 572 and 574 may be formed through the first and second insulating interlayers 500 and 560 to expose top surfaces of the first and second source/drain layers 492 and 494, respectively.

A metal layer may be formed on the exposed top surfaces of the first and second source/drain layers 492 and 494, sidewalls of the third and fourth openings 572 and 574, and the second insulating interlayer 560, and may be annealed to form first and second metal silicide patterns 582 and 584 on the first and second source/drain layers 492 and 494, respectively. A non-reacted portion of the metal layer may be removed.

Referring to FIGS. 57 to 60, first and second contact plugs 592 and 594 may be formed on the first and second metal silicide patterns 582 and 584 to fill the third and fourth openings 572 and 574, respectively.

The first and second contact plugs 592 and 594 may be formed by forming a conductive layer on the first and second metal silicide patterns 582 and 584 and the second insulating interlayer 560 to sufficiently fill the third and fourth openings 572 and 574, and planarizing the conductive layer until a top surface of the second insulating interlayer 560 may be exposed. The conductive layer may include, e.g., doped polysilicon, a metal, a metal nitride, etc.

As illustrated above, in the method of manufacturing the semiconductor device in accordance with example embodiments, a double patterning process may be performed to form the first masks 375 each having the second width W2 in the first and second regions I and II, and the second masks 405 may be formed on both sidewalls of each of the first masks 375 in the second region II. Thus, the third masks 435 each having the third width W3 greater than the second width W2 may be formed. The dummy gate layer structure may be etched using the first and third masks 375 and 435 as an etching mask to form the first and second dummy gate structures 452 and 454 having the different widths W2 and W3 from each other in the first and second regions I and II, respectively, and the first and second dummy gate structures 452 and 454 may be replaced by the first and second gate structures 552 and 554, respectively, to have the different widths W2 and W3 from each other in the first and second regions I and II, respectively.

The above method of forming the minute patterns and the method of manufacturing the semiconductor device using the same may be applied to methods of manufacturing various types of memory devices including minute patterns each having a width less than about 25 nm. For example, the method of forming the minute patterns and the method of manufacturing the semiconductor device may be applied to methods of manufacturing logic devices such as central processing units (CPUs), main processing units (MPUs), or application processors (APs), or the like. Additionally, the method of forming the minute patterns and the method of manufacturing the semiconductor device may be applied to methods of manufacturing volatile memory devices such as DRAM devices or SRAM devices, or non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   sequentially forming a first etch target layer and a first mask layer on a substrate, the substrate having a first region and a second region therein;
   forming a plurality of sacrificial patterns on the first mask layer in a second direction, each of the sacrificial patterns extending in a first direction crossing the second direction;
   forming spacers on sidewalls of each of the sacrificial patterns;
   removing the sacrificial patterns;
   etching the first mask layer using the spacers as an etching mask to form a plurality of first masks;
   forming second masks on sidewalls of each of the first masks in the second direction in the second region to define a plurality of third masks, each of the third masks including each of the first masks and the second masks on the sidewalls thereof; and
   etching the first etch target layer using the first masks and the third masks as an etching mask to form a plurality of first patterns and a plurality of second patterns in the first region and the second region, respectively, each of the first patterns having a first width in the second direction, and each of the second patterns having a second width, the second width being greater than the first width in the second direction.

2. The method of claim 1, wherein the forming second masks on sidewalls of each of the first masks in the second direction in the second region, includes:
   forming a second mask layer on the first masks and the first etch target layer;
   removing a portion of the second mask layer to expose the first masks and a first portion of a top surface of the first etch target layer in the first region, while a portion of the second mask layer in the second region remains; and
   removing a portion of the second mask layer on a second portion of a top surface of the first etch target layer in the second region.

3. The method of claim 2, wherein the removing a portion of the second mask layer in the first region, while a portion of the second mask layer in the second region remains, includes:
   forming a first photoresist pattern on the second mask layer to cover the second region; and
   performing an etching process using the first photoresist pattern as an etching mask to remove the portion of the second mask layer in the first region.

4. The method of claim 2, further comprising:
   before forming the second mask layer on the first masks and the first etch target layer, removing the spacers.

5. The method of claim 2, wherein the removing a portion of the second mask layer on a second portion of a top surface of the first etch target layer in the second region further includes removing a portion of the second mask layer on top surfaces of the first masks in the second region to expose the second portion of the top surface of the first etch target layer and the top surfaces of the first masks in the second region.

6. The method of claim 1, further comprising, prior to the sequentially forming a first etch target layer and a first mask layer:
   forming a second etch target layer on the substrate.

7. The method of claim 6, wherein the first etch target layer includes a material having an etch selectivity with respect to the first masks, the second masks, and the second etch target layer.

8. The method of claim 6, further comprising, after the etching the first etch target layer using the first masks and the third masks as an etching mask to form a plurality of first patterns and a plurality of second patterns:
etching the second etch target layer using the first patterns and the second patterns as an etching mask to form a plurality of third patterns and a plurality of fourth patterns in the first region and the second region, respectively, each of the third patterns having the first width in the second direction, and each of the fourth patterns having the second width in the second direction.

9. The method of claim 8, further comprising, prior to the forming a second etch target layer on the substrate:
forming a third etch target layer on the substrate, and further comprising, after the etching the second etch target layer using the first patterns and the second patterns as an etching mask to form a plurality of third patterns and a plurality of second patterns:
etching the third etch target layer using the third patterns and the fourth patterns as an etching mask to form a plurality of fifth patterns and a plurality of sixth patterns in the first region and the second region, respectively, each of the fifth patterns having the first width in the second direction, and each of the sixth patterns having the second width in the second direction.

10. The method of claim 1, wherein the forming a plurality of sacrificial patterns on the first mask layer in a second direction includes:
forming a sacrificial layer on the first mask layer;
forming a second photoresist pattern on the sacrificial layer; and
etching the sacrificial layer using the second photoresist pattern as an etching mask.

11. The method of claim 10, wherein the forming spacers on sidewalls of each of the sacrificial patterns includes:
forming a spacer layer on the first mask layer to cover the sacrificial patterns; and
anisotropically etching the spacer layer.

12. The method of claim 1, wherein the first region is a logic region in which logic devices are formed, and the second region is a static random access memory (SRAM) region in which SRAM devices are formed.

13. A method of manufacturing a semiconductor device, the method comprising:
sequentially forming a gate layer, a hard mask layer, and an intermediate layer on a substrate, the substrate having first and second regions therein;
forming a plurality of first masks on the intermediate layer in a second direction, each of the first masks extending in a first direction crossing the second direction;
forming a second mask layer on the first masks and the intermediate layer;
removing a portion of the second mask layer in the first region;
removing portions of the second mask layer on top surfaces of the first masks and a top surface of the intermediate layer to form second masks on sidewalls of each of the first masks in the second region, the top surfaces of the first masks and the top surface of the intermediate layer being exposed, and each of the first masks and the second masks on the sidewalls of each of the first masks defining a third mask;
etching the intermediate layer using the first masks and the third masks as an etching mask to form a plurality of first patterns and a plurality of second patterns in the first region and the second region, respectively, each of the first patterns having a first width in the second direction, and each of the second patterns having a second width in the second direction, the second width being greater than the first width;
etching the hard mask layer using the first patterns and the second patterns as an etching mask to form a plurality of first hard masks and a plurality of second hard masks in the first region and the second region, respectively; and
etching the gate layer using the first hard masks and the second hard masks as an etching mask to form first gates and second gates in the first region and the second region, respectively.

14. The method of claim 13, wherein the removing a portion of the second mask layer in the first region includes:
forming a first photoresist pattern on the second mask layer to cover the second region; and
performing a wet etching process using the first photoresist pattern as an etching mask to remove the portion of the second mask layer in the first region.

15. The method of claim 13, wherein the removing portions of the second mask layer on top surfaces of the first masks and a top surface of the intermediate layer to form second masks on sidewalls of each of the first masks in the second region further comprises removing top surfaces of the first masks and a top surface of the intermediate layer in the first region, and the exposed top surfaces of the first masks and the exposed top surface of the intermediate layer in the second region.

16. The method of claim 13, wherein the first masks, the second mask layer, and the intermediate layer include materials having etch selectivities with respect to one another.

17. The method of claim 13, wherein the forming a plurality of first masks on the intermediate layer includes:
sequentially forming a first mask layer and a sacrificial layer on the intermediate layer;
forming a second photoresist pattern on the sacrificial layer;
etching the sacrificial layer using the second photoresist pattern as an etching mask to form a plurality of sacrificial patterns in the second direction, each of the sacrificial patterns extending in the first direction;
forming a spacer layer on the first mask layer to cover the sacrificial patterns;
anisotropically etching the spacer layer to form spacers on the sidewalls of each of the sacrificial patterns; removing the sacrificial patterns; and
etching the first mask layer using the spacers as an etching mask, after the removal of the sacrificial patterns.

18. A method of manufacturing a semiconductor device, the method comprising:
forming an isolation layer pattern on a substrate to define an active fin on the substrate, the substrate including first and second regions, a lower portion of the active fin covered by the isolation layer pattern, and an upper portion of the active fin protruding above a top surface of the isolation layer pattern;
sequentially forming a dummy gate layer structure, a hard mask layer, and an intermediate layer on the active fin and the isolation layer pattern;

forming a plurality of first masks on the intermediate layer in a second direction, each of the first masks extending in a first direction substantially perpendicular to the second direction;

forming second masks on sidewalls of each of the first masks in the second region to define a third mask, the third mask including each of the first masks and the second masks on the sidewall of each of the first masks;

etching the intermediate layer using the first masks and the third masks as an etching mask to form a plurality of first patterns and a plurality of second patterns in the first region and the second region, respectively;

etching the hard mask layer using the first patterns and the second patterns as an etching mask to form a plurality of first hard masks and a plurality of second hard masks in the first regions and the second regions, respectively;

etching the dummy gate layer structure using the first hard masks and the second hard masks as an etching mask to form a plurality of first dummy gate structures and a plurality of second dummy gate structures in the first region and the second region, respectively, each of the first dummy gate structures having a first width in the second direction, and each of the second dummy gate structures having a second width in the second direction, the second width being greater than the first width; and replacing the first dummy gate structures and the second dummy gate structures with first gate structures and second gate structures, respectively.

19. The method of claim 18, wherein the forming a plurality of first masks on the intermediate layer in a second direction includes:

sequentially forming a first mask layer and a sacrificial layer on the intermediate layer;

patterning the sacrificial layer to form a plurality of sacrificial patterns in the second direction, each of the sacrificial patterns extending in the first direction;

forming a spacer layer on the first mask layer to cover the sacrificial patterns;

anisotropically etching the spacer layer to form spacers on sidewalls of each of the sacrificial patterns;

removing the sacrificial patterns; and after removing the sacrificial patterns, etching the first mask layer using the spacers as an etching mask.

20. The method of claim 18, wherein the forming second masks on sidewalls of each of the first masks in the second region includes:

forming a second mask layer on the first masks and the intermediate layer;

etching a portion of the second mask layer in the first region; and removing portions of the second mask layer on top surfaces of the first masks and a top surface of the intermediate layer in the second region, and top surfaces of the first masks and a top surface of the intermediate layer both in the first and second regions.

* * * * *